United States Patent
Choi et al.

(10) Patent No.: US 9,059,067 B2
(45) Date of Patent: Jun. 16, 2015

(54) SEMICONDUCTOR DEVICE WITH INTERPOSER AND METHOD MANUFACTURING SAME

(75) Inventors: Yun-seok Choi, Hwaseong-si (KR); So-young Lim, Hwaseong-si (KR); In-won O, Jeonbuk (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 732 days.

(21) Appl. No.: 13/235,546

(22) Filed: Sep. 19, 2011

(65) Prior Publication Data

US 2012/0091468 A1 Apr. 19, 2012

(30) Foreign Application Priority Data

Oct. 1, 2010 (KR) .................. 10-2010-0095959

(51) Int. Cl.
  *H01L 29/00* (2006.01)
  *H01L 23/14* (2006.01)
  *H01L 21/48* (2006.01)
  *H01L 23/498* (2006.01)
  *H01L 25/065* (2006.01)

(52) U.S. Cl.
  CPC ............ *H01L 23/147* (2013.01); *H01L 21/486* (2013.01); *H01L 23/49827* (2013.01); *H01L 25/0655* (2013.01); *H01L 2224/16227* (2013.01); *H01L 2924/15192* (2013.01); *H01L 2924/15311* (2013.01); *H01L 2924/19105* (2013.01); *H01L 2224/16225* (2013.01)

(58) Field of Classification Search
  CPC ........... H01L 2224/73265; H01L 2224/73204; H01L 24/16; H01L 2224/32145; H01L 25/0657; H01L 2224/97; H01L 2224/16145; H01L 23/3128; H01L 24/81; H01L 24/13; H01L 24/82; H01L 21/76898; H01L 2224/13; H01L 2924/19011; H01L 21/486; H01L 2224/16225; H01L 2224/16227; H01L 23/147; H01L 23/49827; H01L 25/0655; H01L 2924/15192; H01L 2924/15311
  USPC ......... 257/700–713, 777–783, 508, 621, 774, 257/E23.01, 1
  See application file for complete search history.

(56) References Cited

U.S. PATENT DOCUMENTS

| | | | | |
|---|---|---|---|---|
| 6,661,088 B1 * | 12/2003 | Yoda et al. | ..................... | 257/700 |
| 7,563,714 B2 | 7/2009 | Erturk et al. | | |
| 2004/0084781 A1 * | 5/2004 | Ahn et al. | ..................... | 257/777 |
| 2005/0023664 A1 * | 2/2005 | Chudzik et al. | ............... | 257/678 |
| 2005/0133930 A1 * | 6/2005 | Savastisuk et al. | ........... | 257/774 |
| 2008/0173993 A1 | 7/2008 | Andry et al. | | |
| 2010/0052099 A1 * | 3/2010 | Chang et al. | .................. | 257/535 |
| 2010/0164062 A1 * | 7/2010 | Wang et al. | ................... | 257/532 |
| 2011/0031581 A1 * | 2/2011 | West | .............................. | 257/508 |
| 2011/0079917 A1 * | 4/2011 | Xia et al. | ...................... | 257/774 |

FOREIGN PATENT DOCUMENTS

JP 2008-282884 11/2008
KR 100789393 A 12/2007

* cited by examiner

*Primary Examiner* — H Tsai
(74) *Attorney, Agent, or Firm* — Volentine & Whitt, PLLC

(57) ABSTRACT

A semiconductor device includes an interposer mounting a semiconductor chip. The interposer includes a silicon substrate having a recessed region formed on a first surface, a first through via penetrating a first region of the silicon substrate from the first surface to an opposing second surface, an insulator disposed in the recessed region, and a first wire pattern at least partially disposed on the insulator and electrically connecting the first through via to the semiconductor chip.

16 Claims, 19 Drawing Sheets

SEMICONDUCTOR DEVICE WITH INTERPOSER AND METHOD MANUFACTURING SAME

CROSS-REFERENCE TO RELATED APPLICATIONS

This application claims the benefit of Korean Patent Application No. 10-2010-0095959 filed on Oct. 1, 2010, the subject matter of which is hereby incorporated by reference.

BACKGROUND OF THE INVENTION

The inventive concept relates to semiconductor devices and methods of manufacturing same. More particularly, the inventive concept relates to semiconductor devices including an interposer and methods of manufacturing same.

The design and operating demands placed on the data storage capacity and data transmission speeds of many different types of semiconductor devices have dramatically increased with emerging consumer electronics. Accordingly, attempts to integrate different semiconductor chips performing various functions into smaller sized semiconductor devices have continued. However, these attempts are complicated by parallel demands for higher operating speeds.

The miniaturization of high speed semiconductor systems including multiple chips requires the use of multi-level fabrication techniques that use interposers, through vias, and redistribution patterns. Through via techniques and the use of redistribution patterns allow high performance semiconductor devices to reduce signal transmission distances as compared with the signal transmission distances required by system using bonding wires.

SUMMARY OF THE INVENTION

One embodiment of the inventive concept provides a semiconductor device including; an interposer including a silicon substrate having a recessed region formed on a first surface, a through via penetrating the silicon substrate from the first surface to an opposing second surface, an insulator disposed in the recessed region, and a first wire pattern at least partially disposed on the insulator and electrically connected to the through via. A semiconductor chip is mounted on the first surface or the second surface of the interposer and electrically connected to the first wire pattern.

Another embodiment of the inventive concept provides a semiconductor device including an interposer. The interposer includes; a silicon substrate having a recessed region formed on a first surface, a first through via penetrating a first region of the silicon substrate from the first surface to an opposing second surface, an insulator disposed in the recessed region, and a first wire pattern at least partially disposed on the insulator and electrically connected to the first through via. A first semiconductor chip is mounted over the first region and on the first surface of the silicon substrate, and is electrically connected to the first wire pattern.

Another embodiment of the inventive concept provides a semiconductor device comprising; a semiconductor chip mounted on an interposer. The interposer comprises; a silicon substrate having a first surface and an opposing second surface, an insulator disposed in a recessed region formed in the first surface, a first through via penetrating a first region of the silicon substrate from the first surface to an opposing second surface, a second through via penetrating a second region of the silicon substrate from the first surface to the second surface, a first wire pattern at least partially disposed directly on the insulator, electrically connected to the first through via, and transmitting a non-power signal to the semiconductor chip, and a second wire pattern disposed directly on the first surface of the silicon substrate outside the insulator, electrically connected to the second through via, and transmitting a power signal to the semiconductor chip.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1A:
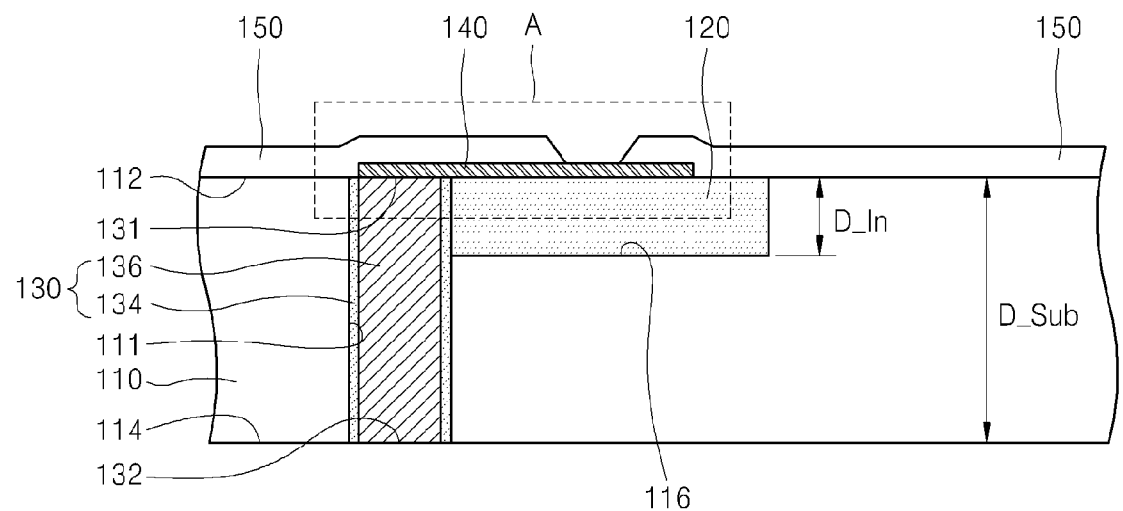
FIGS. 1A-1F, 2A-2B, 3, 4, 5A-5B and 6 are related cross-sectional views and plan views of semiconductor devices according to embodiments of the inventive concept.

The inventive concept will now be described in the context of certain embodiments illustrated in the accompanying drawings. The inventive concept may, however, be embodied in many different forms and should not be construed as being limited to only the illustrated embodiments. Rather, the embodiments are provided so that this disclosure will be thorough and complete, and will fully convey the concept of the invention to those skilled in the art.

In the drawings, the size and or relative size of certain elements and regions may be exaggerated for clarity. Throughout the drawings and written description, like numbers and labels are used to denote like or similar elements, features and/or method steps.

It will also be understood that when an element is referred to as being "on" or "connected to" another element, it may be directly on or connected to the other element, or intervening elements may also be present. In contrast, when an element is referred to as being "directly on" another element or layer, there are no intervening elements of layers present. Other expressions for explaining relationships between constituent elements, for example, "between, and "directly between" may be understood as the same manner as above.

It will be understood that, although the terms first, second, third, etc., may be used herein to describe various elements, these elements should not be limited by these terms. These terms are only used to distinguish one element, component, region, layer or section from another region, layer or section. For example, without departing from the scope of the inventive concept, a first constituent element may be designated as a second constituent element, and similarly, the second constituent element may be designated as the first constituent element.

The singular forms include the plural forms unless the context clearly indicates otherwise. It will further understood that the terms "comprise" and/or "comprising" when used in this specification, specify the presence of stated features, integers, steps, operations, elements, and/or components, but do not preclude the presence or addition of one or more other features, integers, steps, operations, elements, components, and/or groups thereof.

Unless otherwise defined, terminologies used in the embodiments of the inventive concept have the same meaning as commonly understood by one of ordinary skill in the art to which this inventive concept belongs.

FIGS. 1A through 1F are partial cross-sectional views and plan views of a semiconductor device according to an embodiment of the inventive concept.

Referring to FIGS. 1A through 1F (collectively FIG. 1), the semiconductor device comprises a so-called interposer. An "interposer" is broadly defined as a structure having one or more surfaces to which a semiconductor element, conductive pattern, and/or semiconductor layer or region may be included, attached, deposited, mounted or otherwise provided. In certain aspect, an interposer may be understood as an element within a semiconductor device providing a fabrication surface.

Referring to FIG. 1 as an example, an interposer comprises a substrate 110, an insulator 120 formed in a recessed region 116 of the substrate 110, a through via 130 that passes through at least a portion of the substrate 110, and a wire pattern 140 that extends on a surface of the substrate 110 and is electrically connected to the through via 130. In another example, the interposer may include only the substrate 110 and the wire pattern 140, where at least a portion of the wire pattern 140 is disposed on the insulator 120.

In certain embodiments, the substrate 110 principally forming the interposer may be a silicon substrate. This silicon substrate may be a pure silicon substrate un-doped with an impurity, a p-type silicon substrate doped with a group III element, such as boron, an n-type silicon substrate doped with a group V element, such as phosphate, a silicon carbide (SiC) substrate, or a silicon germanium (SiGe) substrate. The silicon substrate 110 provides a first surface 112 and an opposing second surface 114 as principal interposer surfaces.

As noted, the substrate 110 of FIG. 1 includes the recessed region 116. The recessed region 116 may be formed, for example, by selecting removing a portion of the first surface 112.

In the illustrated example of FIG. 1, the insulator 120 is disposed on the first surface 112, and more specifically is disposed in the recessed region 116 of the first surface 112. Alternately, the insulator 120 may be disposed on the entirety of the first surface 112, or designated portion(s) of the first surface 112. In the illustrated example of FIG. 1, an upper surface of the insulator 120 is substantially flush with the first surface 112.

The insulator 120 may be formed from a low dielectric constant material. The low dielectric constant material may be a dielectric material having a dielectric constant of 4 or less. For example, the insulator 120 may include one or a combination of at least two selected from the group consisting of silicon oxide (SiOx), fluorosilicate glass (FSG), silicon oxycarbide (SiOC), carbon-doped silicon oxide (SiOCH), silicon nitride, or silicon oxynitride.

The insulator 120 may have a thickness (D_In) less than a thickness (D_sub) of the substrate 110. For example, when the semiconductor device has a thickness in a range from about 50 μm to about 100 μm, the thickness D_In of the insulator 120 may be greater than 10 μm and less than the thickness D_sub of the substrate 110. In certain embodiments, the thickness D_In of the insulator 120 should be at least 10 μm in order to shield the substrate 110 from electrical effects of elements and/or electrical connections disposed on the insulator 120. In certain embodiments, the thickness D_In of the insulator 120 may be defined by the depth of the recessed region 116 formed in the first surface 112.

The through via 130 extends from the first surface 112 to the second surface 114 through the substrate 110. The through via 130 may include a via hole 111 penetrating the body of the substrate 110, a via insulating film 134 formed on inner wall(s) of the via hole 111, and a via electrode 136 formed on the via insulating film 134 and substantially filling a residual portion of the via hole 111. The through via 130 may further include a barrier layer (not shown) and/or a seed layer (not shown) between the via insulating film 134 and the via electrode 136. An upper surface 131 of the through via 130 is exposed on the first surface 112 of the substrate 110, and a lower surface 132 of the through via 130 is exposed on the second surface 114 of the substrate 110.

Figure 1B:
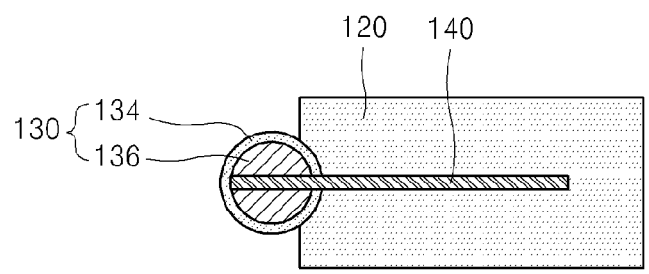

Referring to section "A" of FIG. 1A and FIG. 1B, only a portion of the upper surface 131 of the through via 130 may contact the insulator 120.

Figure 1C:
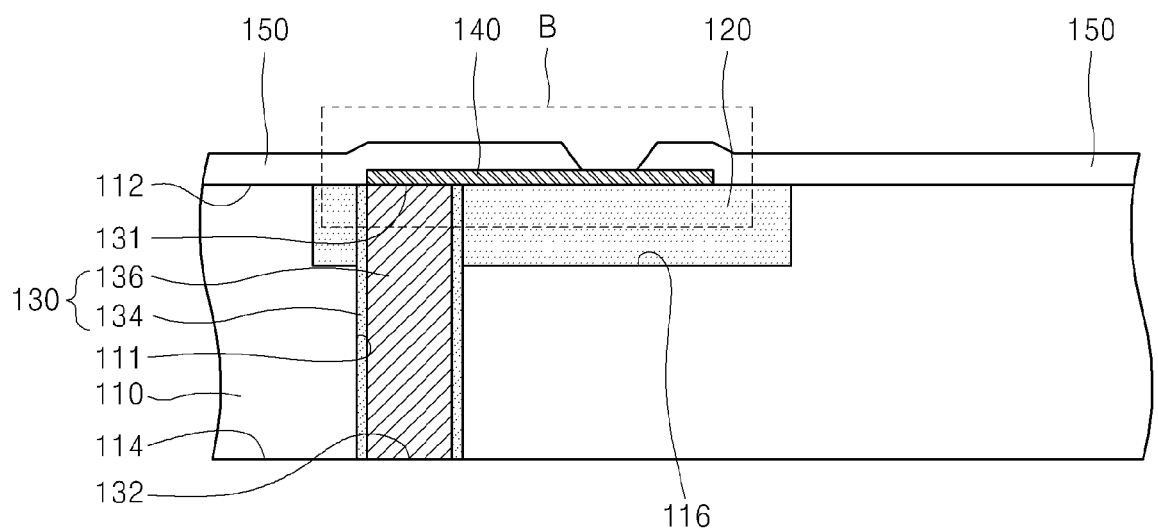
Figure 1D:
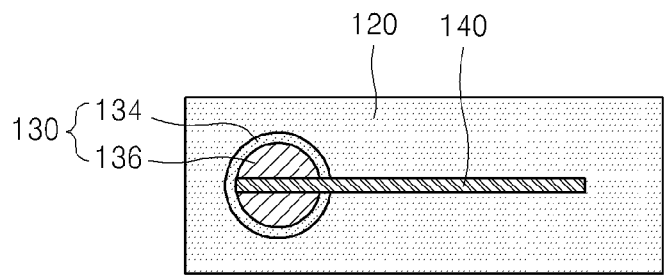

Referring to section "B" of FIG. 1C and FIG. 1D, the exposed upper surface 131 of the through via 130 may be surrounded by the insulator 120. In this configuration, since only the via insulating film 134 directly contacts the surrounding insulator 120, a capacitance that might otherwise be generated between the via electrode 136, the via insulating film 134, and the silicon substrate 110 may be reduced.

Figure 1E:
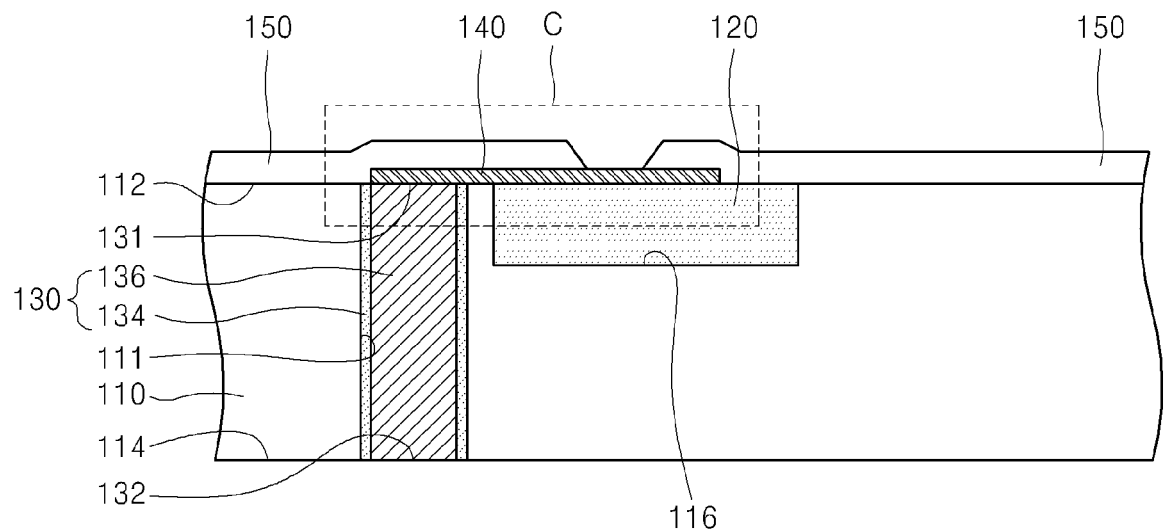
Figure 1F:
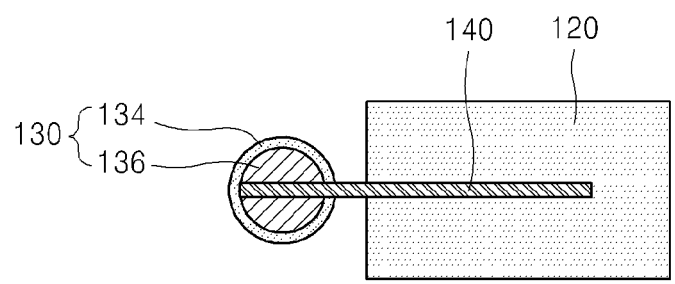

Referring to section C of FIG. 1E and FIG. 1F, the upper surface 131 of the through via 130 may not contact any portion of the insulator 120.

In the embodiments of FIG. 1, the wire pattern 140 is disposed on the first surface 112 of the substrate 110 and is electrically connected to the via electrode 136 of the through via 130. In certain embodiments, the wire pattern 140 may be a redistribution layer. The wire pattern 140 may have a width equal to or different from the width of a cross-section of the through via 130. At least a portion of the wire pattern 140 is disposed on the insulator 120 and physically contacts the insulator 120. Since the insulator 120 includes a low dielectric constant material, the increase in resistance associated with the reduction in width of the wire pattern 140, the increase in capacitance between wire patterns when a plurality of wire patterns are formed, and speed reduction and/or cross-talk due to RC delay may be improved. The thickness D_In of the insulator 120 may be determined in consideration of the above effects.

The semiconductor device illustrated in FIG. 1 further includes a passivation film 150 covering the first surface 112 of the substrate 110. The passivation film 150 may cover the first surface 112 of the substrate 110 wholly or in part, but will typically selectively expose at least a portion of the wire pattern 140. The through via 130 may be electrically connected to another semiconductor device through the exposed portion of the wire pattern 140. For example, the exposed portion of the wire pattern 140 may be used as a connection pad. Alternatively, a connection pad (not shown) may be formed on the exposed portion of the wire pattern 140. The passivation film 150 that covers the first surface 112 of the substrate 110 protects the semiconductor device from environmental factors and mechanical impact. The passivation film 150 may include an insulating material. For example, the passivation film 150 may include at least one selected from the group consisting of silicon oxide, silicon nitride, silicon oxynitride, and polyimide, or a combination of these materials.

According to the illustrated embodiments of FIG. 1, since the wire pattern 140 is disposed on the insulator 120, signal loss may be reduced when transmitting signal(s) through the wire pattern 140. However, when the substrate 110 used in the semiconductor device is formed of silicon, signal loss may occur due to the particular characteristics of the silicon substrate 110 when transmitting signal(s) through the wire pattern 140. However, since at least a portion of the wire pattern 140 is disposed on the insulator 120, the signal loss due to the silicon substrate 110 may be reduced, thereby improving the operating characteristics of the constituent semiconductor device incorporating the interposer. Also, when at least a portion of the through via 130 contacts the insulator 120, a capacitance generated by the through via 130 may be reduced, thereby further improving the signal transmitting characteristics of the semiconductor device.

Figure 2A:
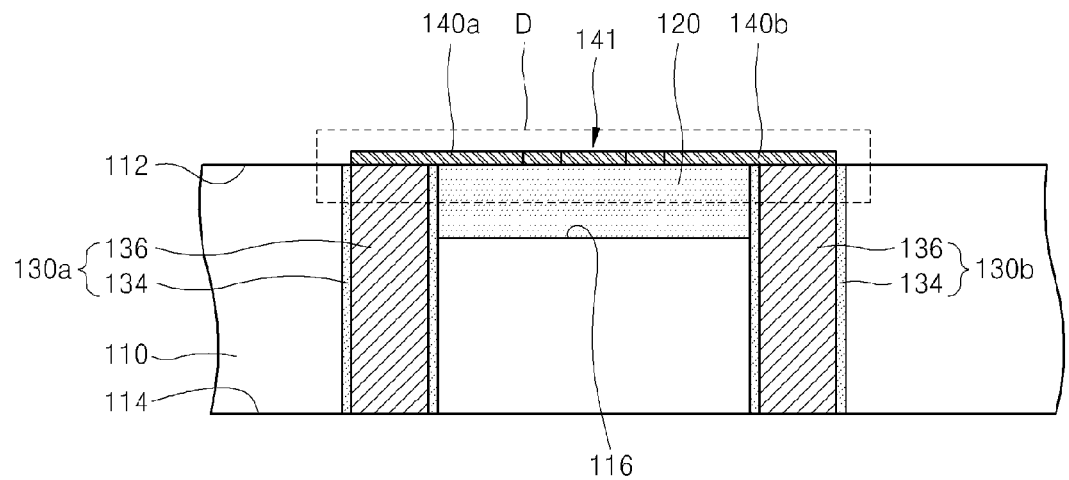
Figure 2B:
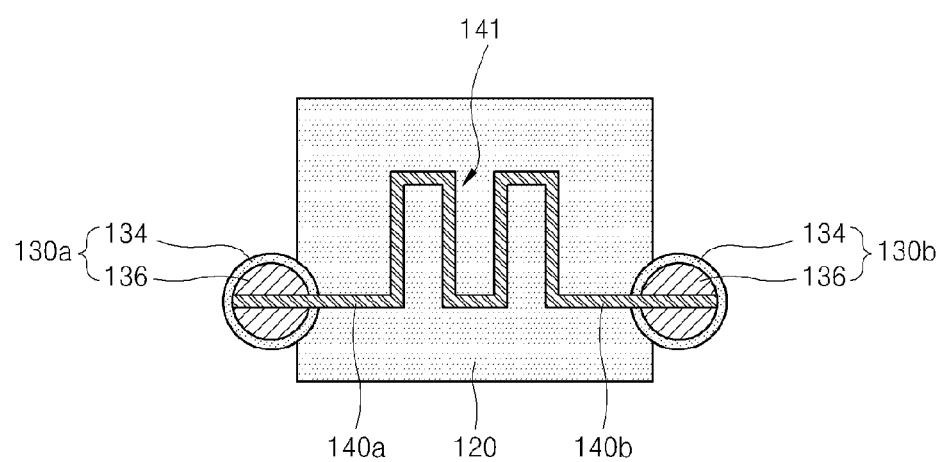

FIG. 2A is a cross-sectional view of a relevant portion of a semiconductor device according to another embodiment of the inventive concept. FIG. 2B is a plan view of the section "D" of FIG. 2A.

Referring to FIGS. 2A and 2B, an interposer of a semiconductor device consistent with an embodiment of the inventive concept comprises insulator 120 disposed between adjacent through vias 130a and 130b. The insulator 120 may be separated from the adjacent through vias 130a and 130b, or may partially contact the through vias 130a and 130b. The semiconductor device may include a first sub-wire pattern 140a that is connected to the first through via 130a and extends on the insulator 120 and/or a second sub-wire pattern 140b that is connected to the second through via 130b and extends on the insulator 120. The first sub-wire pattern 140a and the second sub-wire pattern 140b may be electrically connected to or insulated from each other.

A passive device 141 may be disposed on the first surface 112 of the substrate 110. As shown in FIG. 2B, the passive device 141 may be electrically connected between the first and second sub-wire patterns 140a and 140b. The passive device 141 may be attached to the first surface 112 of the substrate 110 after separately forming the first and second sub-wire patterns 140a and 140b or may be formed simultaneously with the first and second sub-wire patterns 140a and 140b. For example, in certain embodiments, the passive device 141 may be an inductor having a spiral or meander shape. With this configuration, the passive device 141 may be connected to a circuit external to the semiconductor device through the first and second through vias 130a and 130b. At least a portion of the passive device 141 may be disposed on the insulator 120. The passive device 141 may be disposed directly on the insulator 120 and in physical contact with the insulator 120. Since at least a portion of the passive device 141 is disposed on the insulator 120, signal loss caused by the substrate 110 may be reduced.

Figure 3:
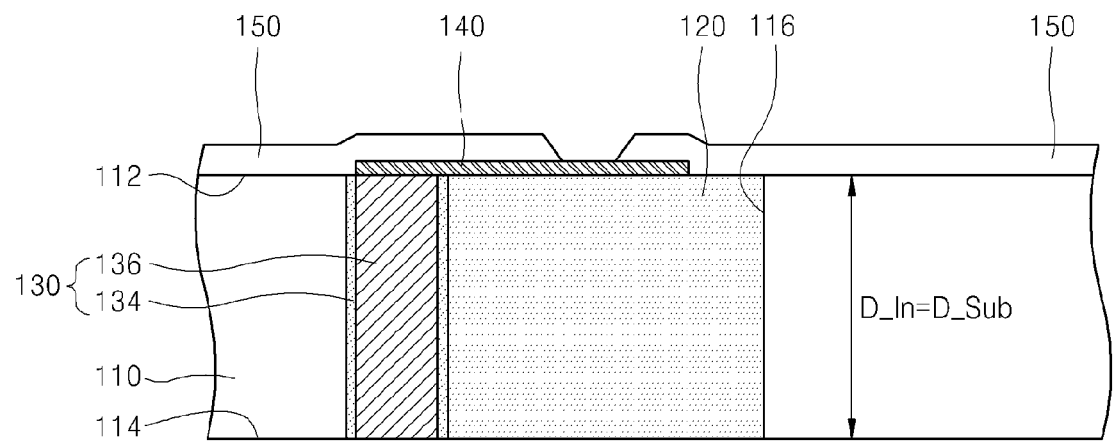

FIG. 3 is a cross-sectional view of a semiconductor device according to another embodiment of the inventive concept.

Referring to FIG. 3, an interposer of a semiconductor device consistent with an embodiment of the inventive concept comprises the insulator 120 having a thickness D_In that extends from the first surface 112 to the second surface 114 of the substrate 110. The thickness D_In of the insulator 120 may thus be equal to the thickness D_Sub of the substrate 110. For example, an upper surface of the insulator 120 may be formed to be substantially flush with the first surface 112 of the substrate 110, and a lower surface of the insulator 120 may be formed to be substantially flush with the second surface 114 of the substrate 110. The insulator 120 may contact or be separate from a portion of the through via 130.

The wire pattern 140 may extend over the insulator 120 and be electrically connected to the through via 130. The wire pattern 140 is formed on the first surface 112 of the substrate 110, or alternatively, the wire pattern 140 may be formed on the second surface 114 of the substrate 110. The passivation film 150 that selectively exposes a portion of the wire pattern 140 may be formed on the first surface 112 and/or the second surface 114 of the substrate 110.

Figure 4:
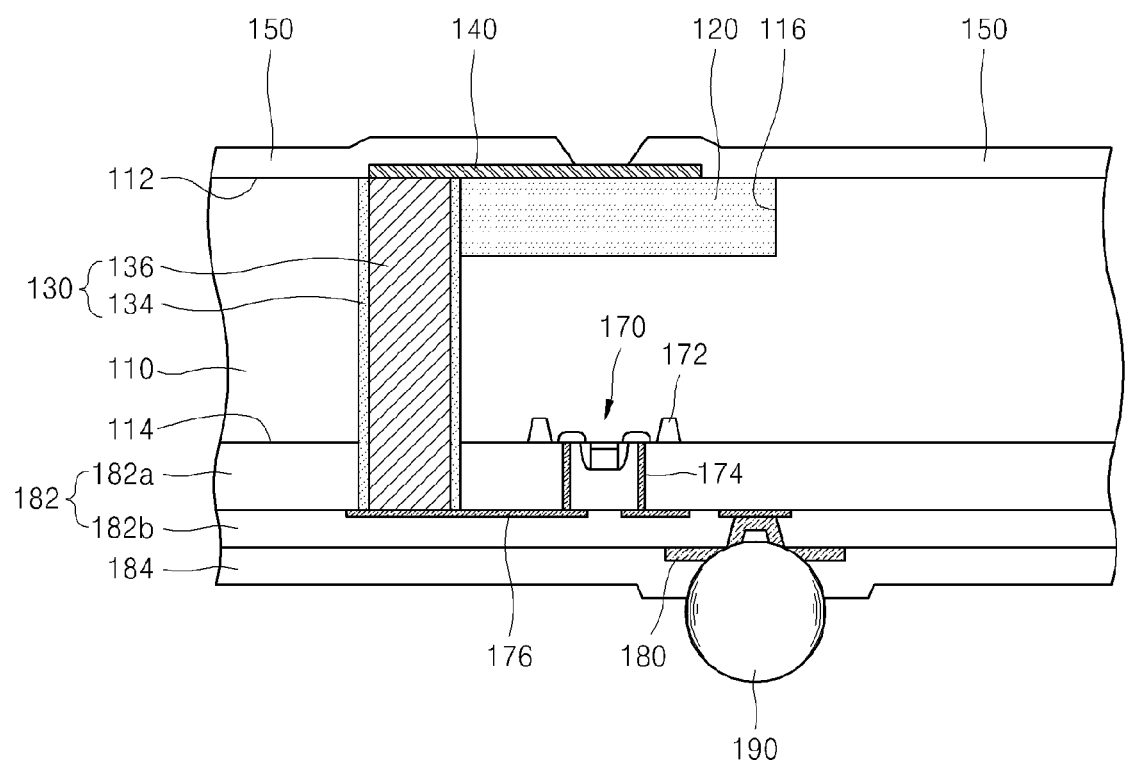

FIG. 4 is a cross-sectional view of a semiconductor device according to another embodiment of the inventive concept.

Referring to FIG. 4, an interposer of a semiconductor device consistent with an embodiment of the inventive concept comprises an active semiconductor element (e.g., a transistor or integrated circuit). A device separation film 172 and a transistor 170 may be formed on the second surface 114 of the substrate 110. The device separation film 172 may have a thickness less than the thickness D_In of the insulator 120. For example, the device separation film 172 may have a depth in a range from 0.3 to 0.5 μm, that is, from 3,000 to 5,000 Å from the second surface 114 of the substrate 110. A contact via 174, an inner wire pattern 176, a chip pad 180, and an interlayer insulating layer 182 may be formed to connect the transistor 170 with a circuit external to the semiconductor device. The interlayer insulating layer 182 may cover the second surface 114 of the substrate 110 and may have a thickness in a range from 0.5 to 1.0 μm. The interlayer insulating layer 182 may include at least two insulating films 182a and 182b. A passivation film 184 that exposes at least a portion of the chip pad 180 may be formed on the interlayer insulating layer 182.

A conductive portion 190 may be formed to be electrically connected to the chip pad 180. For example, the conductive portion 190 may be one selected from the group consisting of a conductive bump, a conductive spacer, a solder ball, a pin grid array (PGA), and a combination of thereof. The semiconductor device may be physically and/or electrically connected to another semiconductor device or a board through the conductive portion 190.

When an integrated circuit is formed on the second surface 114 of the substrate 110, the insulator 120 may be formed in the first surface 112 of the substrate 110. For example, the second surface 114 may be designated as a front-side or active area, and the first surface 112 may be designated as a backside of the substrate 110. The through via 130 may be electrically connected to the inner wire pattern 176 or the chip pad 180 penetrating through at least a portion of the interlayer insulating layer 182. The first surface 112 of the substrate 110 may be electrically connected to the transistor 170 formed on the second surface 114 through the inner wire pattern 176, the through via 130, and the wire pattern 140. For example, the wire pattern 140 may be a backside redistribution layer.

Semiconductor devices according to the embodiments of the inventive concept, such as those illustrated in FIGS. 1 to 4 exhibit improved operating characteristics characterized by reduced signal loss caused by the substrate 110 when a signal is transmitted via the through via 130 and the wire pattern 140.

Figure 5A:
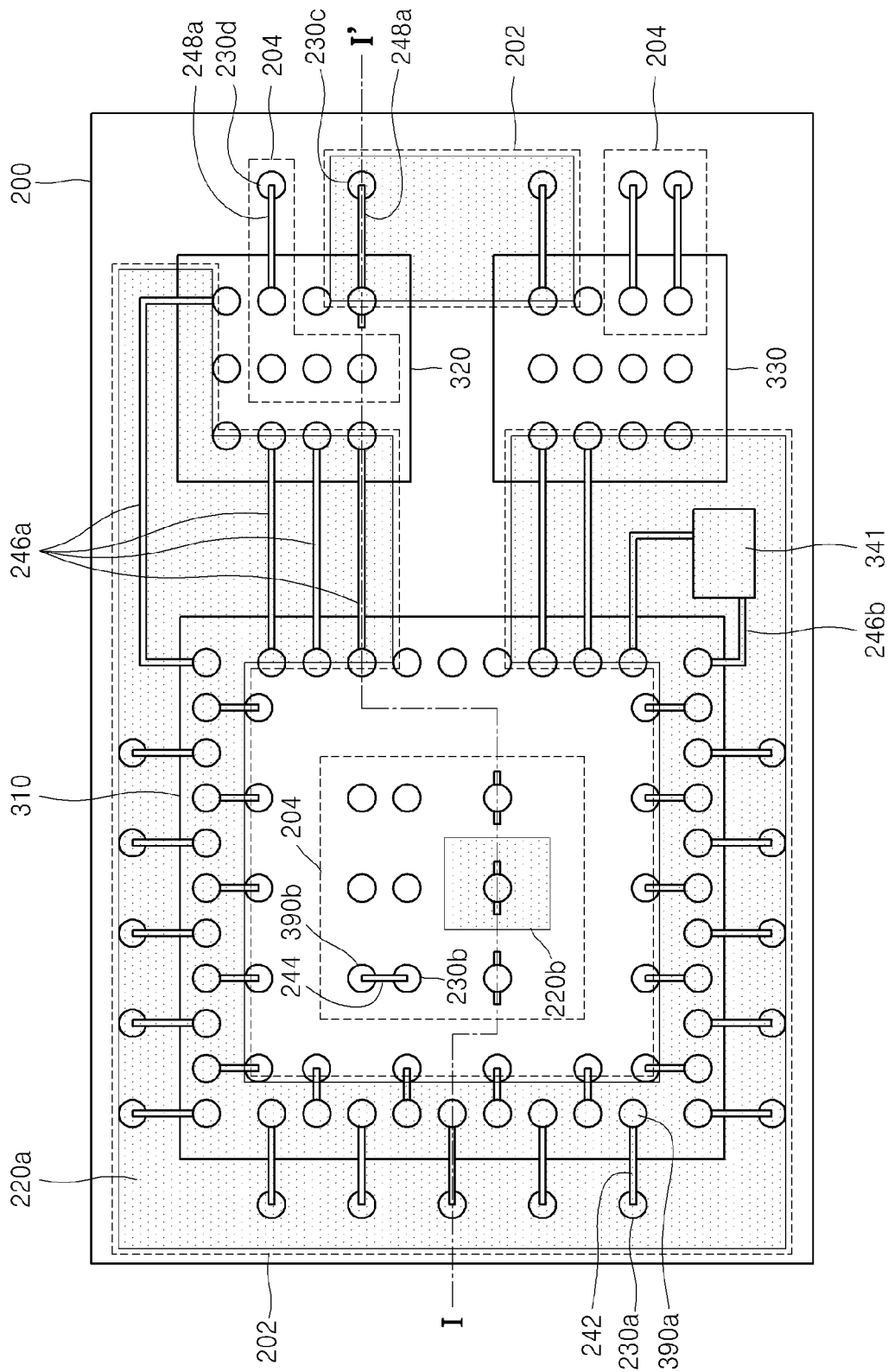
Figure 5B:
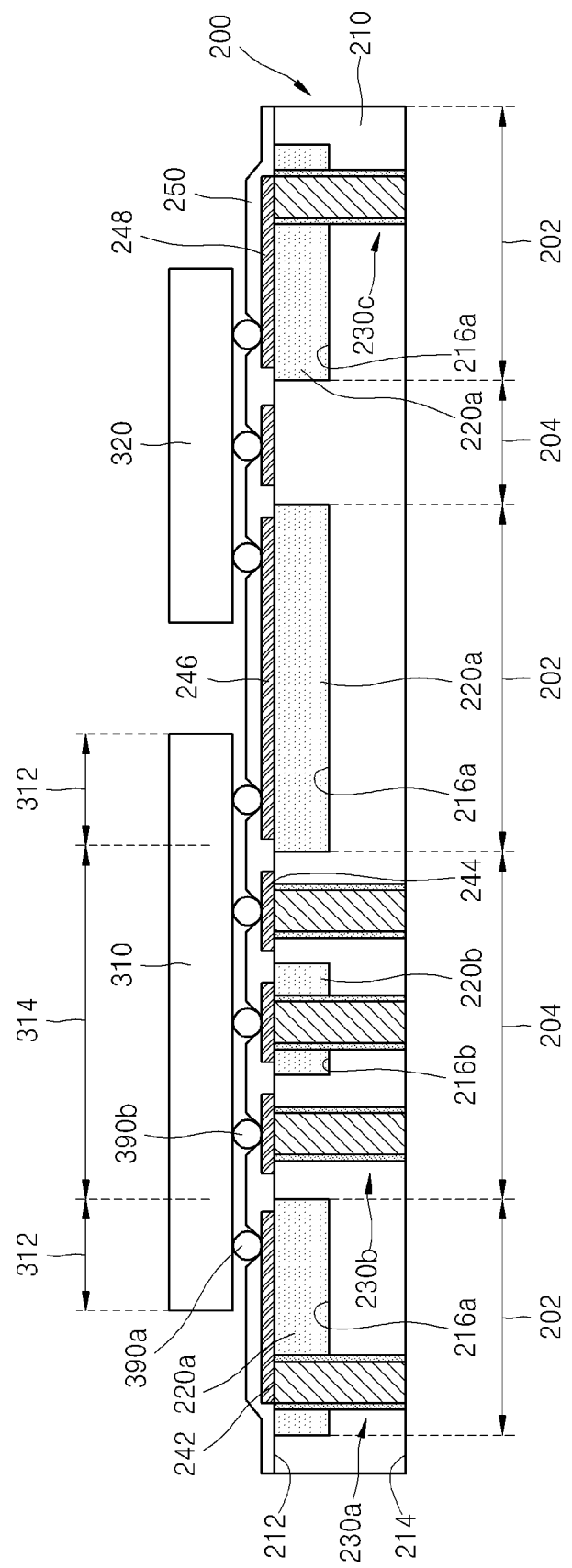

FIG. 5A is a plan view of a semiconductor device according to another embodiment of the inventive concept. FIG. 5B is a cross-sectional view taken along the line I-I' of FIG. 5A.

Referring to FIGS. 5A and 5B, the illustrated semiconductor device may be realized, for example, as a semiconductor package. The semiconductor package may include an interposer 200 and a first semiconductor chip 310 mounted on the interposer 200, wherein the interposer 200 has a configuration like one of those in the foregoing illustrated embodiments described with reference to FIGS. 1 through 3.

The interposer 200 comprises a first region 202 and a second region 204. The first region 202 includes a first insulator 220a disposed on a first surface 212 of a substrate 210. The first insulator 220a may be disposed in a recessed region 216a of the substrate 210. The substrate 210 and the first insulator 220a may be respectively similar to the substrate 110 and the insulator 120 described with reference to FIGS. 1 through 3. The second region 204 may be a region of the substrate 210 in which the first insulator 220a is not formed. The arrangement of the first region 202 and the second region 204 may vary according to the function and/or location of the first semiconductor chip 310 mounted on the interposer 200. For example, at least a portion of the first region 202 may overlap an edge region 312 of the first semiconductor chip 310 in a vertical direction. The first insulator 220a may partially overlap a region where the first semiconductor chip 310 is mounted. At least a portion of the second region 204 may overlap a central region 314 of the first semiconductor chip 310 in a vertical direction.

A first through via 230a may be disposed in the first region 202, and a second through via 230b may be disposed in the second region 204. The first through via 230a may be disposed to be separated from the first insulator 220a, or at least a portion of the first through via 230a may contact the first insulator 220a. Various signals, possibly including power signals, may be transmitted to the first semiconductor chip 310 through the first and second through vias 230a and 230b. For example, a non-power signal (e.g., a data/address/control signal) may be transmitted to the first semiconductor chip 310 through the first through via 230a, and a power signal may be transmitted to the first semiconductor chip 310 through the second through via 230b.

A first wire pattern 242 that extends over the first insulator 220a and is electrically connected to the first through via 230a may be formed. When the first through via 230a is disposed separately from the first insulator 220a, at least a portion of the first wire pattern 242 may be disposed on the first insulator 220a. The first through via 230a and the first semiconductor chip 310 may be electrically connected through the first wire pattern 242. The first semiconductor chip 310 may be physically and/or electrically connected to the first wire pattern 242 through a first conductive portion 390a interposed between the first semiconductor chip 310 and the interposer 200. For example, when the first conductive portion 390a and the first through via 230a are arranged in a vertical direction, the first conductive portion 390a and the first through via 230a may be connected through the first wire pattern 242.

When a signal is transmitted to the first semiconductor chip 310 through the first through via 230a and the first wire pattern 242, signal loss may be reduced by disposing the first wire pattern 242 on the first insulator 220a.

A second wire pattern 244 that extends on the substrate 210 and is electrically connected to the second through via 230b may be formed. The second through via 230b and the first semiconductor chip 310 may be electrically connected through the second wire pattern 244. The first semiconductor chip 310 may be physically and/or electrically connected to the second wire pattern 244 through a second conductive portion 390b interposed between the first semiconductor chip 310 and the interposer 200. For example, when the second conductive portion 390b and the second through via 230b are not arranged in vertical orientation, the second conductive portion 390b and the second through via 230b may be connected through the second wire pattern 244. As another example, when the second conductive portion 390b and the second through via 230b are vertically oriented, the second wire pattern 244 need not be provided. Connection pads (not shown) may be formed respectively between the first and second through vias 230a and 230b and the first and second conductive portion 390a and 390b.

When power is supplied to the first semiconductor chip 310 through the second through via 230b and the second wire pattern 244, thermal energy dissipation may increase by disposing the second wire pattern 244 in the second region 204. For example, when the substrate 210 includes silicon and the first insulator 220a includes a silicon oxide, the thermal conductivity of silicon is approximately 149 W/m/K at 300 K, and that of the silicon oxide is approximately 1.38 W/m/K at 300 K. That is, the thermal conductivity characteristic of silicon is far superior to that of the silicon oxide. Accordingly, in configurations wherein the second wire pattern 244 will transmit high energy signals (e.g., a power signal) in the second region 204 in which the first insulator 220a is not formed will be more thermally efficient than when a similar high energy signal is transmitted via a similar wire pattern is formed in the first region 202 in which the first insulator 220a is formed.

As another example, a second insulator 220b may be disposed at least in a portion of the second region 204. The second insulator 220b may be formed in a recessed region 216b of the substrate 210. The second insulator 220b may include a material having greater thermal conductivity than that of the substrate 210. For example, the second insulator 220b may include an insulating material that includes conductive particles. At least a portion of the second wire pattern 244 may be disposed on the second insulator 220b. Since the second insulator 220b includes a material having a thermal conductivity greater than that of the substrate 210, when a high energy signal (e.g., a power signal) is transmitted through the second wire pattern 244, thermal emission efficiency of the semiconductor device may be increased.

A second semiconductor chip 320 may be disposed on the interposer 200. The second semiconductor chip 320 may be separate from the first semiconductor chip 310. The second semiconductor chip 320 and the first semiconductor chip 310 may be the same type of chips or different kinds of chips.

Third wire patterns 246a and 246b may be formed on the interposer 200. At least portions of the third wire patterns 246a and 246b may be disposed on the first insulator 220a of the first region 202. The first insulator 220a on which the first wire pattern 242 is disposed and the first insulator 220a on which the third wire patterns 246a and 246b are disposed may be formed to be separated from or connected to each other.

The first semiconductor chip 310 and the second semiconductor chip 320 may be electrically connected through the third wire pattern 246a. For example, the first semiconductor chip 310 may be a logic chip that includes a memory control circuit or a system on chip that includes a processor, and the second semiconductor chip 320 may be a memory chip that includes a memory circuit. The second semiconductor chip 320 may receive a control signal from the first semiconductor chip 310 through the third wire pattern 246a. Since the third wire pattern 246a is disposed on the first insulator 220a, signal loss may be reduced in a signal transmitting process and a high operation of the semiconductor package is possible.

The interposer 200 may include third through vias 230c and 230d that are electrically connected to the second semiconductor chip 320. The third through vias 230c and 230d may be electrically connected to the second semiconductor chip 320 through fourth wire patterns 248. For example, when a signal required for operating the second semiconductor chip 320 is transmitted through the third through via 230c, the fourth wire pattern 248a may be disposed in the first region 202. Since the fourth wire pattern 248a is disposed on the first insulator 220a in the first region 202, an operation characteristic may be increased by reducing signal loss in a signal transmitting process. As another example, when a power signal required to operate the second semiconductor chip 320 is transmitted via the third through via 230d, the fourth wire pattern 248b may be disposed in the second region 204. If the substrate 210 has a thermal conductivity greater than that of the first insulator 220a, heat generated from the power transmitting process may be efficiently conducted by forming the fourth wire pattern 248b not disposed on the first insulator 220a, but rather disposed on the substrate 210.

A passive device 341 may be formed on the interposer 200. The passive device 341 may be disposed in the first region 202 by being separately manufactured or manufactured as a part of a constituent wire pattern. The passive device 341 may be connected to the first semiconductor chip 310 and/or the second semiconductor chip 320, or connected to the outside of the semiconductor package. For example, the passive device 341 may be electrically connected to the first semiconductor chip 310 through the third wire pattern 246b. The passive device 341 and the third wire pattern 246b may be disposed in the first region 202. Since the passive device 341 and the third wire pattern 246b are disposed on the first insulator 220a, transmission signal loss may be reduced with the first semiconductor chip 310. As another example, the passive device 341 may be connected to a circuit external to the semiconductor package by being electrically connected to the through vias 130a and 130b described with reference to FIGS. 2A and 2B.

A passivation film 250 may cover at least a portion of the interposer 200 and expose at least portions of the first through fourth wire patterns 242, 244, 246a, 246b, 248a, and 248b. The interposer 200 and the first semiconductor chip 310 and/or the second semiconductor chip 320 may be electrically connected through the exposed portions of the first through fourth wire patterns 242, 244, 246a, 246b, 248a, and 248b. Connection pads (not shown) that contact the conductive portions 390a and 390b may be formed on the exposed portions of the first through fourth wire patterns 242, 244, 246a, 246b, 248a, and 248b.

Figure 6:
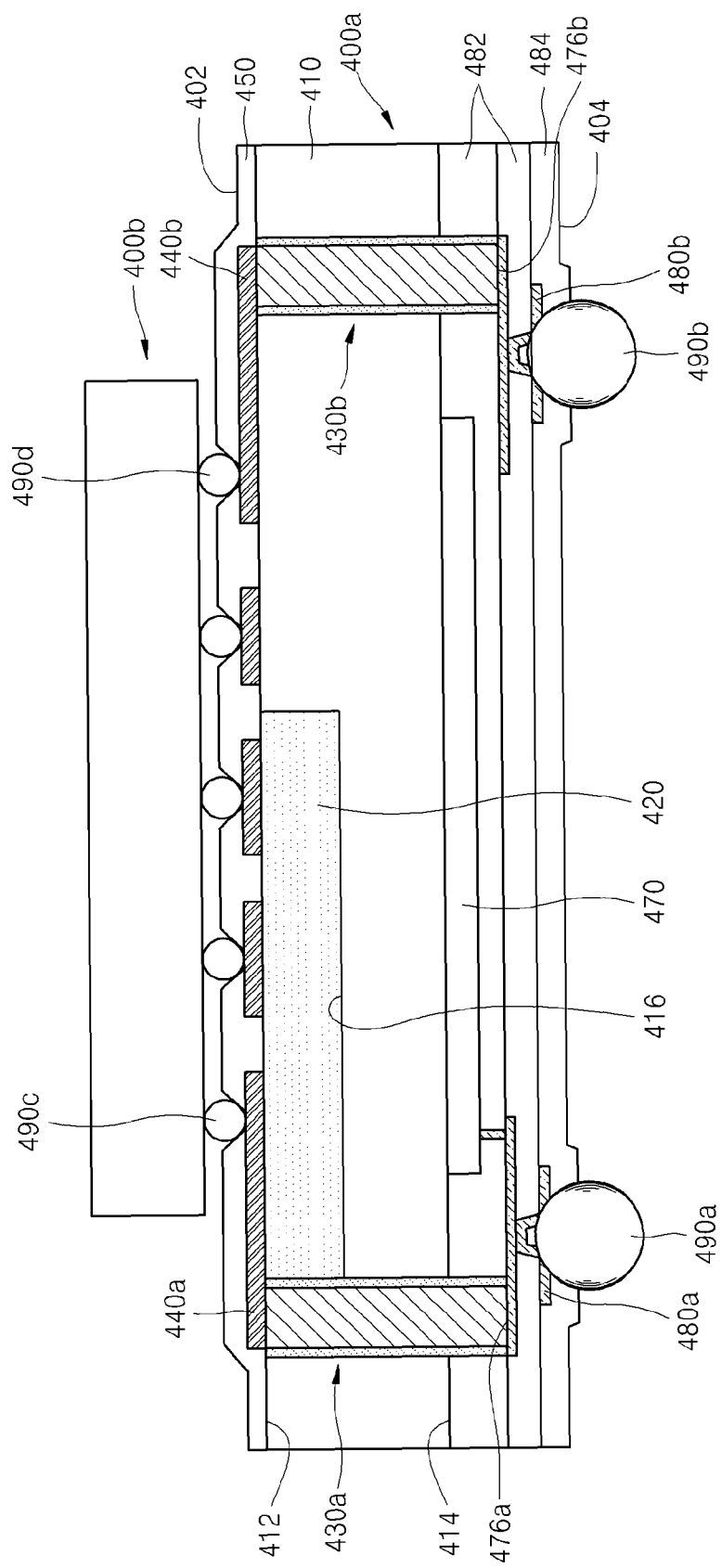

FIG. 6 is a cross-sectional view of a semiconductor device according to another embodiment of the inventive concept.

Referring to FIG. 6, a semiconductor package comprises a first semiconductor chip 400a and a second semiconductor chip 400b stacked on the first semiconductor chip 400a. At least one of the stacked first and second semiconductor chips 400a and 400b may essentially act as an interposer and have, for example, the configuration of the semiconductor chip of FIG. 4.

As shown in FIG. 6, the first semiconductor chip 400a comprises a substrate 410, an insulator 420 formed on a first surface 412 of the substrate 410, a circuit unit 470 formed on a second surface 414 which is opposite to the first surface 412 of the substrate 410, and a first through via 430a that penetrates through at least a portion of the substrate 410. The circuit unit 470, the first through via 430a, and/or a first chip pad 480a may be electrically connected through a first inner wire pattern 476a. An interlayer insulating film 482 and/or a passivation film 484 that cover the circuit unit 470 and the first inner wire pattern 476a may be disposed on the second surface 414 of the substrate 410. A first conductive portion 490a for connecting the first semiconductor chip 400a to the outside may be disposed on the first chip pad 480a.

A first wire pattern 440a may be disposed on the first surface 412 of the substrate 410. The first wire pattern 440a may extend on the first surface 412 of the substrate 410 and be electrically connected to the first through via 430a. At least a portion of the first wire pattern 440a may be disposed on the insulator 420, and may physically contact the insulator 420. The insulator 420 may be disposed separately from the first through via 430a or at least a portion of the insulator 420 may contact the first through via 430a.

A passivation film 450 that exposes at least a portion of the first wire pattern 440a may be formed on the first surface 412 of the substrate 410. A connection pad (not shown) may be disposed on the exposed portion of the first wire pattern 440a.

The second semiconductor chip 400b may be stacked on a first surface 402 of the first semiconductor chip 400a. For example, a second surface 404 of the first semiconductor chip 400a may be an active area and the first surface may be a backside. The second semiconductor chip 400b may be electrically connected to the first semiconductor chip 400a through the first through via 430a and the first wire pattern 440a. For example, the first semiconductor chip 400a may be a logic chip that includes a memory control circuit, and the second semiconductor chip 400b may be a memory chip that includes a memory circuit. A control signal for operating the second semiconductor chip 400b is generated from the memory control circuit 470 of the first semiconductor chip 400a, and may be transmitted to the second semiconductor chip 400b through the first through via 430a and the first wire pattern 440a. Since the first wire pattern 440a is formed on the insulator 420, signal loss in a signal transmission process may be reduced, thereby increasing the operation characteristics of the semiconductor package.

The second semiconductor chip 400b may include a second through via 430b. The second through via 430b is electrically insulated from the first semiconductor chip 400a, and directly connects the second semiconductor chip 400b to the outside of the semiconductor package. For example, a power required for operating the second semiconductor chip 400b may be supplied to the second semiconductor chip 400b through a second conductive portion 490b, a second chip pad 480b, a second inner wire pattern 476b, and the second through via 430b. The second conductive portion 490b, the second chip pad 480b, the second inner wire pattern 476b, and the second through via 430b are electrically insulated from the memory control circuit 470, the first conductive portion 490a, the first chip pad 480a, the first inner wire pattern 476a, and the first through via 430a, and may form an additional power transmission path.

When a second conductive portion 490d interposed between the first semiconductor chip 400a and the second semiconductor chip 400b is not arranged in a vertical direction to the second through via 430b, the second through via 430b may be electrically connected to the second conductive portion 490d through a second wire pattern 440b. The second wire pattern 440b may be disposed on the first surface 412 of the substrate 410, and may physically contact the substrate 410. Since the second wire pattern 440b is disposed on the substrate 410 where the insulator 420 is not formed, heat generated in a process of power transmission may be effectively emitted.

The possible disposition of the insulator 120 within various semiconductor devices contemplated by the inventive concept is not limited to only the embodiments described with reference to FIGS. 1 through 6, and may be modified in various forms according to the disposition design of the wire pattern 140, signal provision requirements as transmitted via the wire pattern 140.

FIG. 7 and FIGS. 8A through 8D respectively are a flow diagram and related cross-sectional views illustrating a method of manufacturing a semiconductor device according to an embodiment of the inventive concept.

Figure 7:
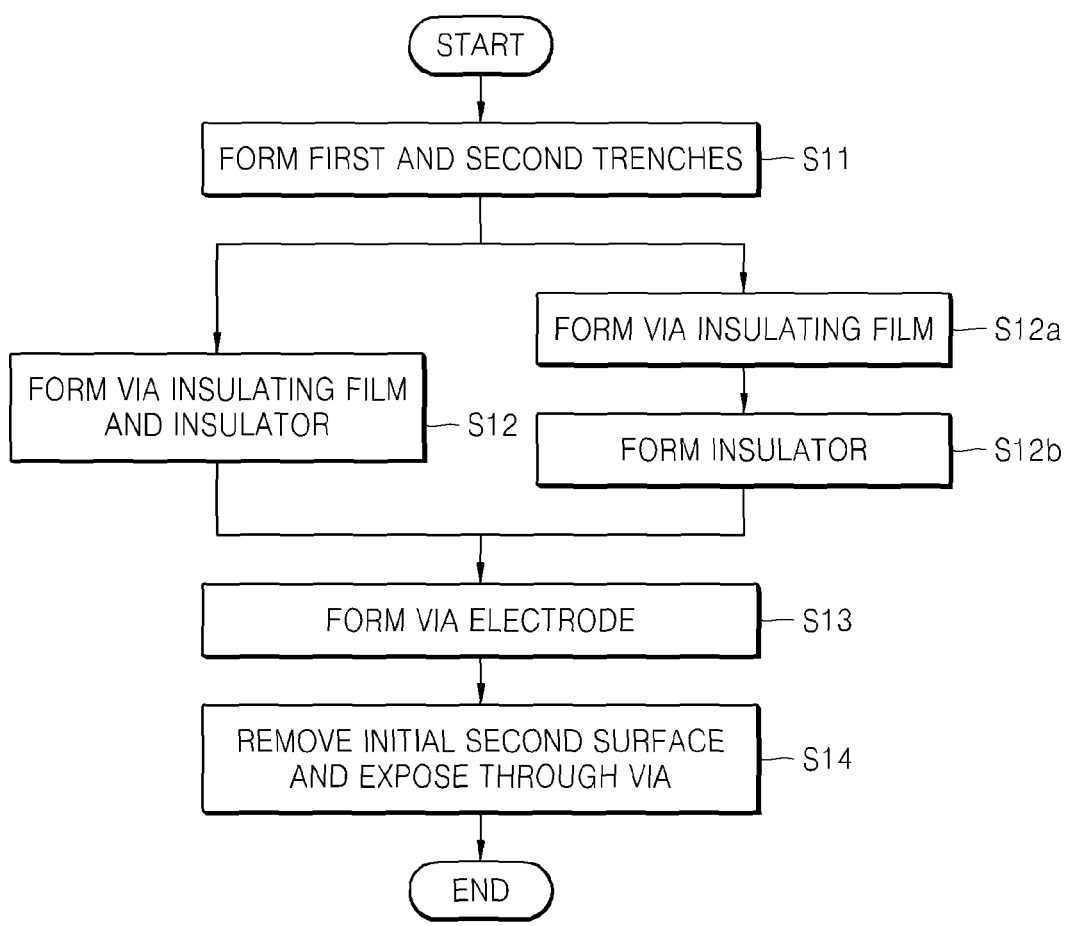
FIGS. 7, 8A-8D, 9, 10A-10E, 11 and 12A-12E are flow diagrams and related cross-sectional views further illustrating methods of manufacturing a semiconductor device according to embodiments of the inventive concept.

Referring to FIG. 7, the method of manufacturing comprises: forming a first trench and second trenches (S11); forming a via insulating film and/or an insulator (S12, S12a, and S12b); forming a via electrode (S13); and exposing a through via by removing an initial second surface of a substrate (S14).

Figure 8A:
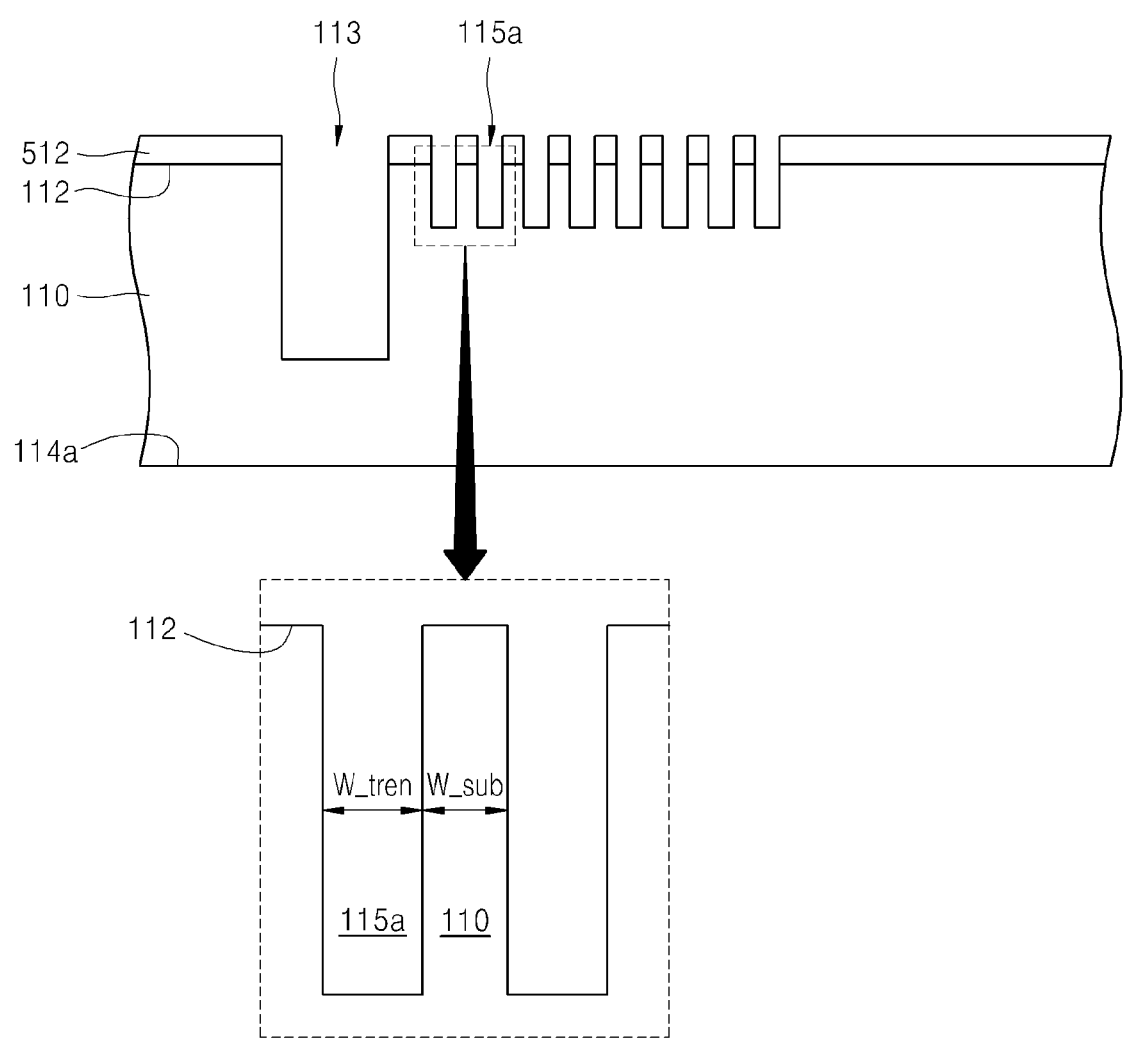

Referring to FIG. 8A, the substrate 110 includes a first surface 112 and an opposing second surface 114a. A first trench 113 and a plurality of second trenches 115a are formed by removing selected portions of the first surface 112 from the substrate 110. For example, the first trench 113 and the second trenches 115a may be formed by anisotropic etching of the substrate 110 using a mask 512. The mask 512 may be formed of a silicon nitride film and/or a photoresist film.

In certain embodiments, the first trench 113 is the via hole 111 of FIG. 1A in which the through via 130 is formed, and the second trenches 115a may be used to receive the insulator 120. The second trenches 115a may be formed with a width W_tren less than that a width of the first trench 113. Therefore, when the first trench 113 and the second trenches 115a are simultaneously formed using the same etching process, the second trenches 115a will have a depth from the first surface 112 of the substrate 110 that is less than a depth of the first trench 113. The width W_tren of each of the second trenches 115a may be determined to a width that may be completely filled when the substrate 110 is oxidized during a subsequently performed oxidation process. For example, when the substrate 110 is a silicon substrate, a ratio between the width W_tren of each of the second trenches 115a and a width W_sub of a gap portion of the substrate 110 separating adjacent second trenches 115a may be, in one particular embodiment, approximately 0.56:0.44. In other words, the width W_tren of each of the second trenches 115a may be in a range from about 1.2 times to about 1.3 times greater than the width W_sub of a gap portion of the substrate 110 between the second trenches 115a.

Figure 8B:
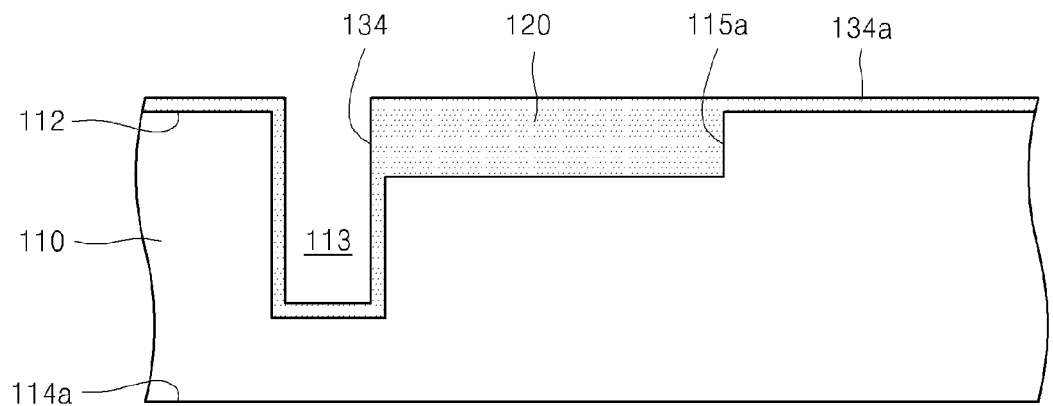

Referring to FIG. 8B, a via insulating film 134 and an insulator 120 respectively may be formed in the first trench 113 and the second trenches 115a.

For example, the via insulating film 134 and the insulator 120 may be simultaneously formed (S12, refer to FIG. 7). The via insulating film 134 and the insulator 120 may be formed by oxidizing the substrate 110. If the width of the first trench 113 is greater than that of each of the second trenches 115a, the via insulating film 134 may be formed on sidewalls and a lower surface of the first trench 113. The second trenches 115a may be completely filled with an oxidation film formed by oxidation. The oxidation process may be performed by exposing the entire first surface 112 of the substrate 110 or by exposing only a region where the oxidation film is to be formed. When the oxidation process is performed by exposing the entire first surface 112 of the substrate 110, a process for removing an oxidation film 134a formed on the first surface 112 may be additionally performed after the oxidation process.

As another example, the via insulating film 134 and the insulator 120 may be separately formed by different processes (S12a and S12b, refer to FIG. 7). The via insulating film 134 may be formed by depositing an insulating material. The deposition of the insulating material may be performed by using a chemical vapour deposition method. After an oxidation process for forming the insulator 120, a deposition process for forming the via insulating film 134 may be additionally performed. The via insulating film 134 having a thickness that may secure reliability may be formed by a deposition process.

Figure 8C:
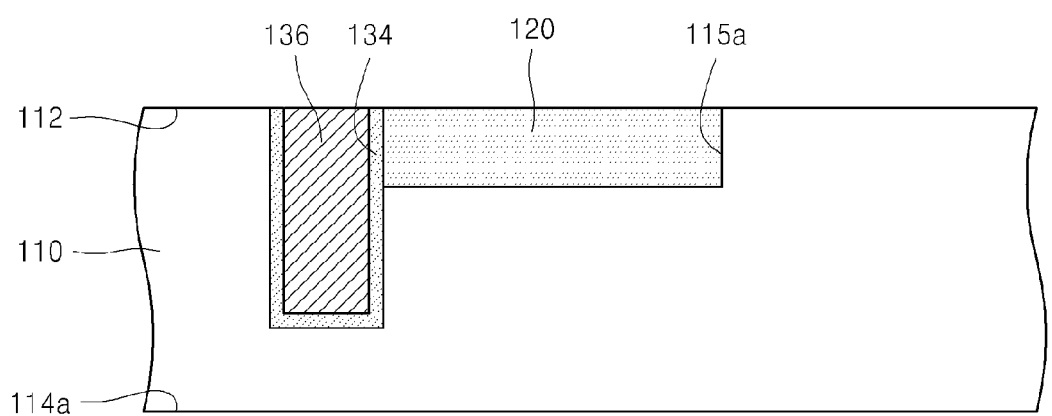

Referring to FIG. 8C, a process for forming a via electrode 136 and exposing the via electrode 136 may be additionally performed. Before the via electrode 136 is formed, a barrier layer may be formed on the via insulating film 134 inside the first trench 113. The barrier layer prevents a conductive material for forming the via electrode 136 from diffusing into the substrate 110. For example, the barrier layer may include Ti, TiN, Ta, or TaN. A conductive material for forming the via electrode 136 may be disposed on the barrier layer. For example, the conductive material may include Ag, Au, Cu, W, or In. the via electrode 136 may completely fill the first trench 113 or may be formed in a film shape on the via insulating film 134. The via electrode 136 may be formed by an electroplating method or a deposition method. The electroplating method may include forming a seed layer on the barrier layer and plating a conductive material using the seed layer.

Figure 8D:
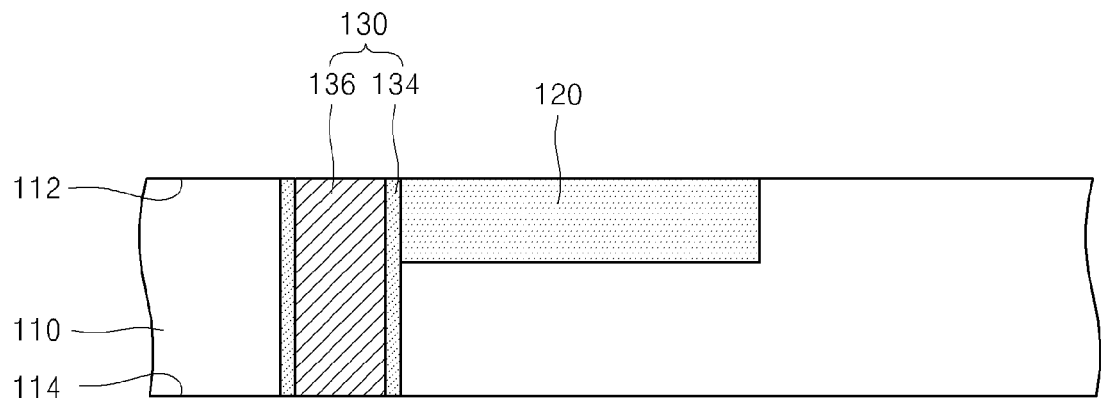

Referring to FIG. 8D, a second surface 114 of the substrate 110 at which a lower side of the via electrode 136 is exposed may be formed by removing the initial second surface 114a of the substrate 110. A process for removing the initial second surface 114a may include polishing the initial second surface 114a and/or etching the initial second surface 114a.

Subsequently, a further configuration of semiconductor elements, such as the one shown in FIG. 1A may be had. That is, the wire pattern 140 may be formed to extend over the insulator 120 and electrically connect the through via 130, and the passivation film 150 may be formed on the first surface 112 of the substrate 110.

FIG. 9 and FIGS. 10A through 10D respectively are a flow diagram and related cross-sectional views showing a method of manufacturing a semiconductor device according to another embodiment of the inventive concept.

Figure 9:
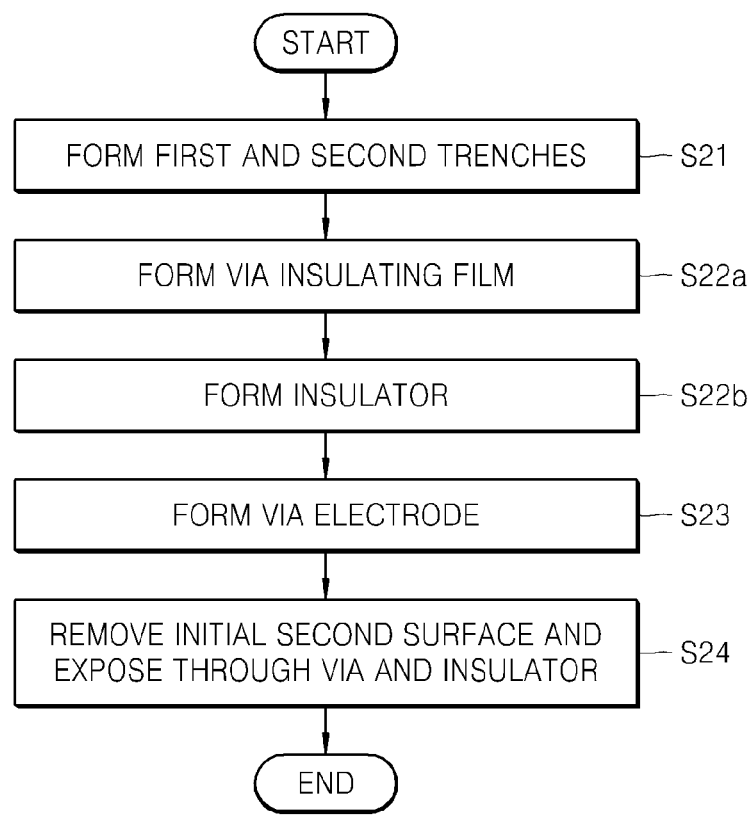

Referring to FIG. 9, the method of manufacturing a semiconductor device, according to the current embodiment of the inventive concept, includes: forming a first trench and the second trenches (S21); forming a via insulating film (S22a); forming an insulator (S22b); forming a via electrode (S23); and exposing a surface of the through via and the insulator by removing an initial second surface of the substrate.

Figure 10A:
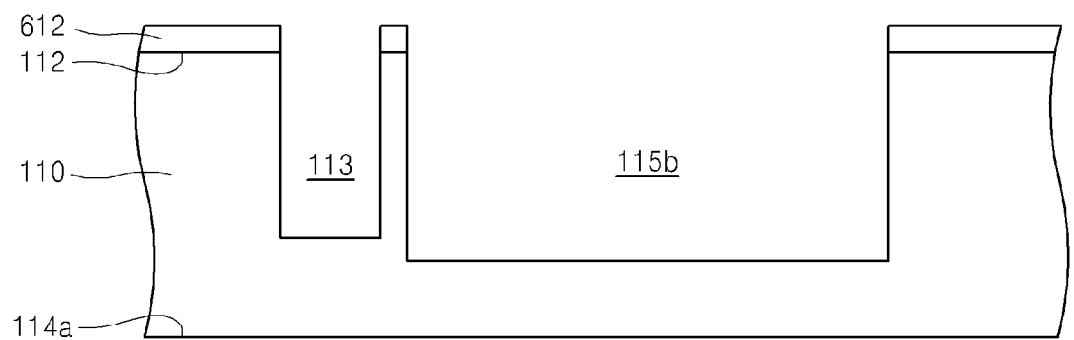

Referring to FIG. 10A, a first trench 113 and a second trench 115b may be formed by removing a portion of the first surface 112 of the substrate 110. The first trench 113 and the second trench 115b may be formed by anisotropic etching the first surface 112 of the substrate 110 using the same mask 612.

The second trench 115b may have a width greater than that of the first trench 113. Accordingly, when the first trench 113 and the second trench 115b are simultaneously formed using the same etching process, the second trench 115b may have a depth from the first surface 112 of the substrate 110 greater than that of the first trench 113.

Figure 10B:
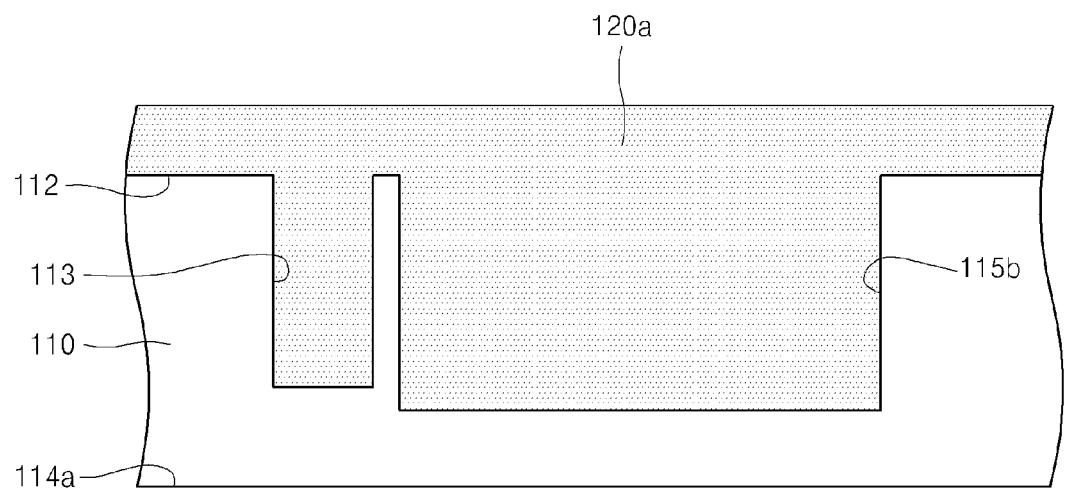
Figure 10C:
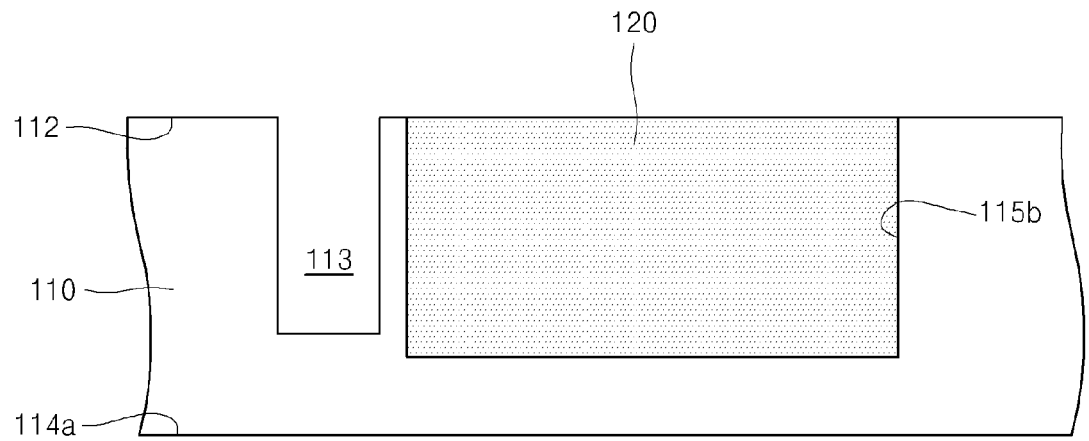
Figure 10D:
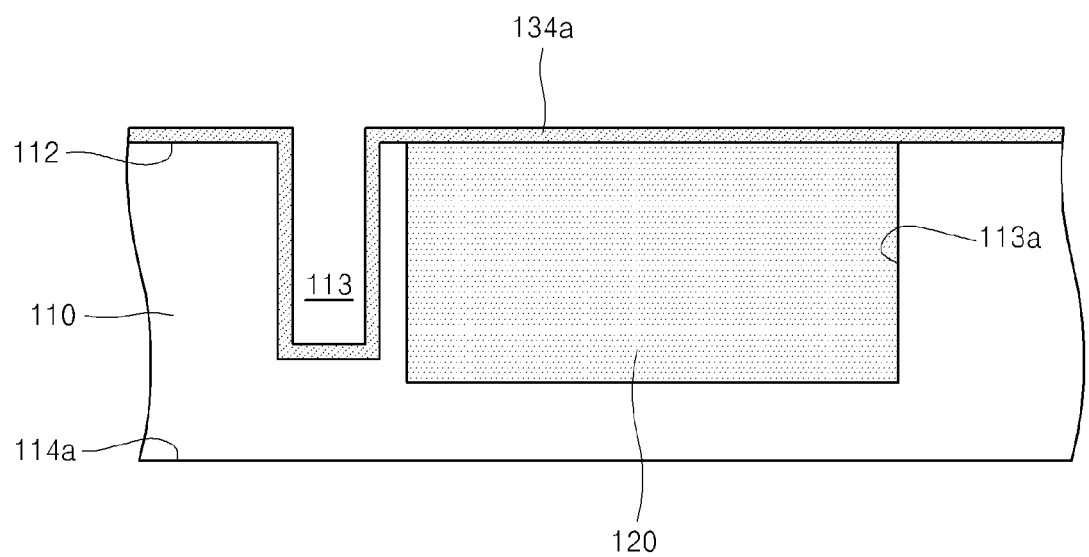

Referring to FIGS. 10B through 10D, the via insulating film 134 may be formed in the first trench 113, and the insulator 120 may be formed in the second trench 115b. The via insulating film 134 and the insulator 120 may be formed by separate processes. For example, the via insulating film 134 may be formed by using a deposition method, and the insulator 120 may be formed by using a deposition or printing method. The methods of forming the insulator 120 are not limited thereto, and the insulator 120 may be formed by various methods that may fill the second trench 115b.

As shown in FIG. 10B, an insulating material 120a is formed on the first surface 112 of the substrate 110 by using a deposition method or printing method. Afterwards, as depicted in FIG. 10 C, the insulator 120 may be formed by removing the insulating material 120a except for the insulating material 120a in the second trench 115b where the insulator 120 will be formed. The insulating material 120a may be removed by a chemical mechanical polishing (CMP) method or an etching method.

Next, as depicted in FIG. 10D, an insulating film 134a is deposited in the first trench 113 and on the first surface 112 of the substrate 110. At this point, after depositing the insulating film 134a in the first trench 113 and on the first surface 112 of the substrate 110, the via insulating film 134 may be formed by removing the insulating film 134a except for the insulating film 134a in the first trench 113 where the via insulating film 134 will be formed. Also, the via insulating film 134 may be formed before the insulator 120 is formed.

Figure 10E:
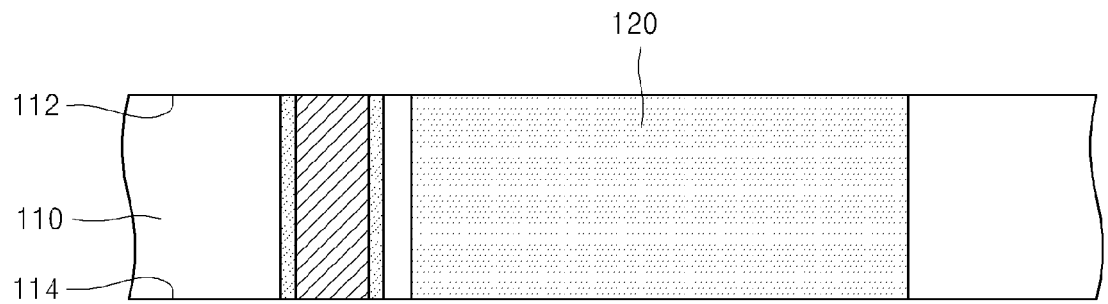

Referring to FIG. 10E, the through via 130 may be formed by forming the via electrode 136 on the via insulating film 134. Afterwards, lower sides of the via electrode 136 and the insulator 120 may be exposed on the second surface 114 of the substrate 110 by removing a portion of the initial second surface 114a of the substrate 110. The semiconductor device of FIG. 3 may be formed by forming the wire pattern 140 (refer to FIG. 3), which extends on the insulator 120 and is electrically connected to the through via 130, and the passivation film 150 (refer to FIG. 3) on the first surface 112 and/or the second surface 114 of the substrate 110.

FIG. 11 and FIGS. 12A through 12E respectively are a flow diagram and related cross-sectional views showing a method of manufacturing a semiconductor device, according to another embodiment of the inventive concept.

Figure 11:
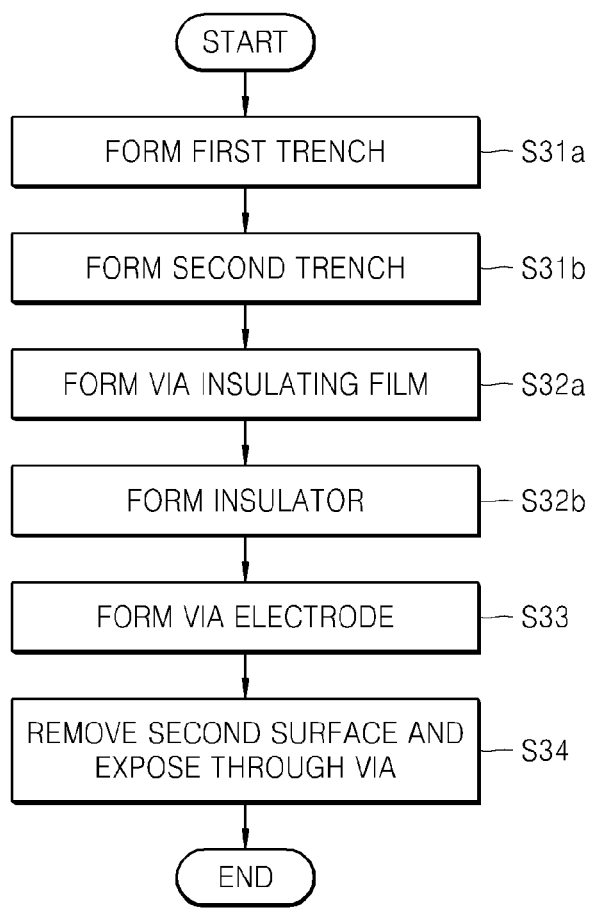

Referring to FIG. 11, the method of manufacturing a semiconductor device, according to the current embodiment of the inventive concept, includes: forming a first trench (S31a); forming a second trench (S31b); forming a via insulating film (S32a); forming an insulator (S32b); forming a via electrode (S33); and exposing a surface of a through via and the insulator by removing an initial second surface of a substrate (S34).

Figure 12A:
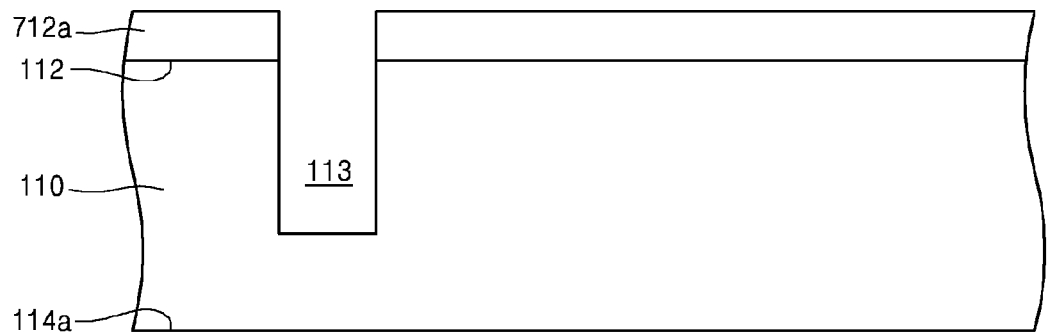
Figure 12B:
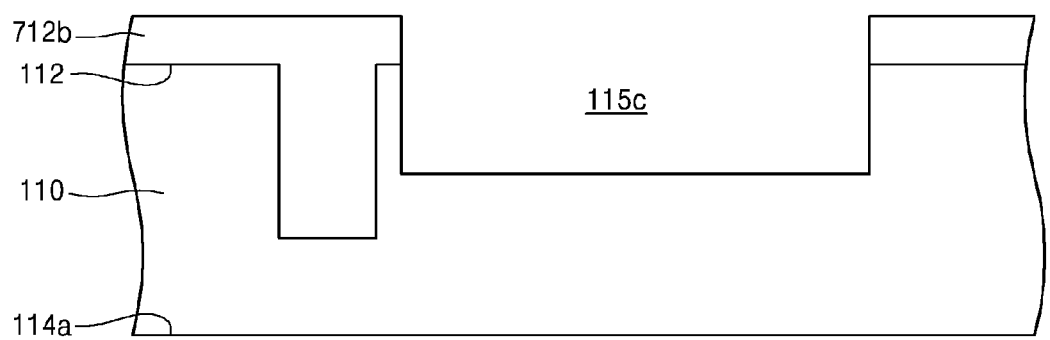

Referring to FIGS. 12A and 12B, a first trench 113 and a second trench 115c may be formed by removing a portion of the first surface 112 of the substrate 110. The first trench 113 may be formed by an anisotropic etching method using a mask 712a that exposes only a region of the substrate 110 where the first trench 113 will be formed. The second trench 115c may be formed separate from the first trench 113. The second trench 115c may be formed by an anisotropic etching method using a mask 712b that exposes only a region of the substrate 110 where the first trench 115c will be formed. The second trench 115c may have a depth greater or less than that of the first trench 113. Meanwhile, the second trench 115c may be formed before or after forming the first trench 113.

Figure 12C:
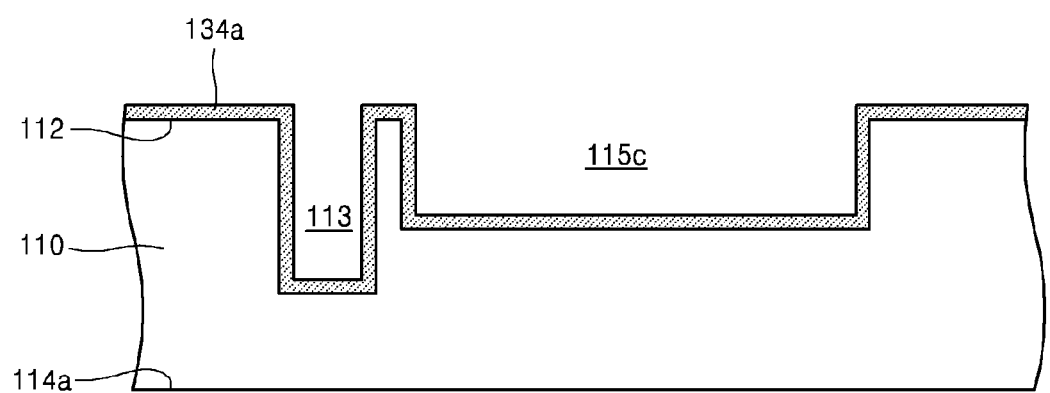
Figure 12D:
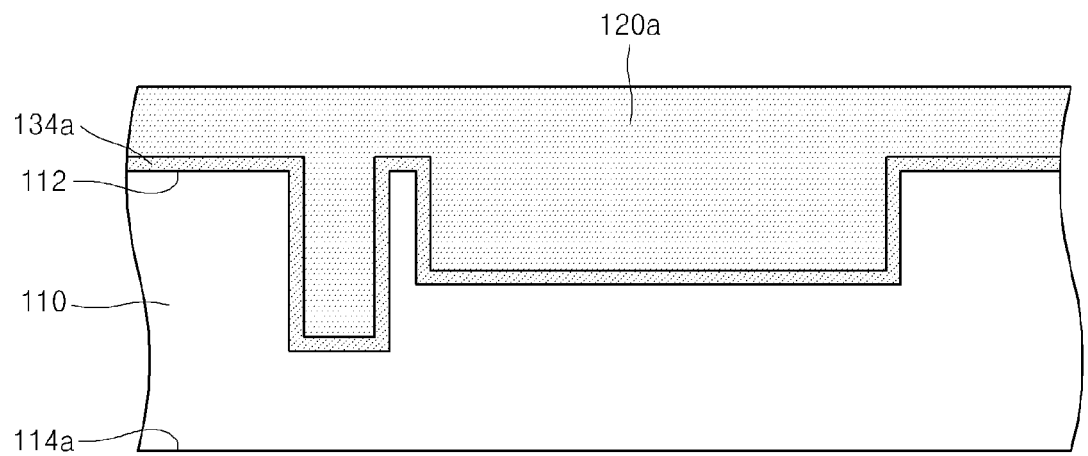
Figure 12E:
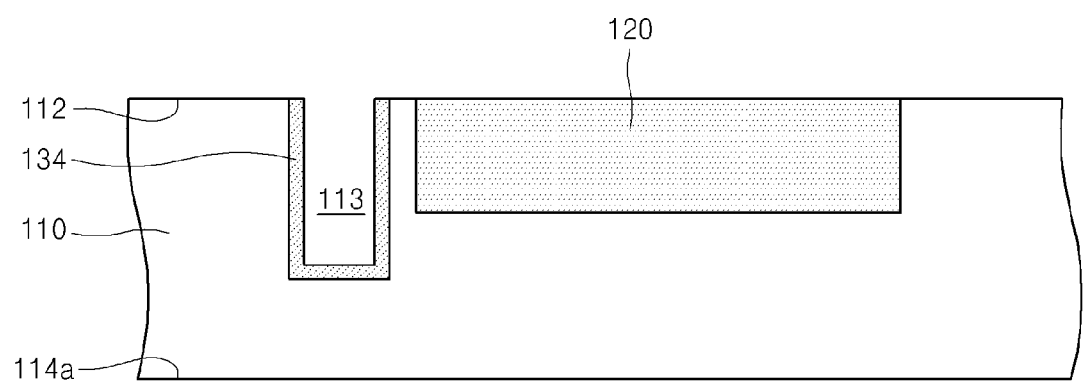

Referring to FIGS. 12C through 12E, the via insulating film 134 and the insulator 120 may be formed. For example, the via insulating film 134 may be formed before the insulator 120 is formed. An insulating film 134a may be deposited on the first surface 112 of the substrate 110. Afterwards, an insulating material 120a may be formed on the first surface 112 of the substrate 110 by a deposition method or a printing method. Next, the insulator 120 is formed by removing the insulating material 120a except for the insulating material 120a in the second trench 115c where the insulator 120 will be formed. When the insulating material 120a is removed, a portion of the insulating film 134a formed on the first surface 112 of the substrate 110 may be removed.

As another example, the via insulating film 134 may be formed after the insulator 120 is formed. The method described with reference to FIGS. 10A through 10D may be applied to the method of manufacturing a semiconductor device according to the embodiment of the inventive concept.

The method of manufacturing a semiconductor device, according to the present embodiment of the inventive concept, is not limited to the above descriptions. For example, the insulator 120 may be formed after the through via 130 is completely formed. Also, as another example, after the insulator 120 is formed, the first trench 113 for forming the through via 130, the via insulating film 134, and the via electrode 136 may be formed.

Figure 13:
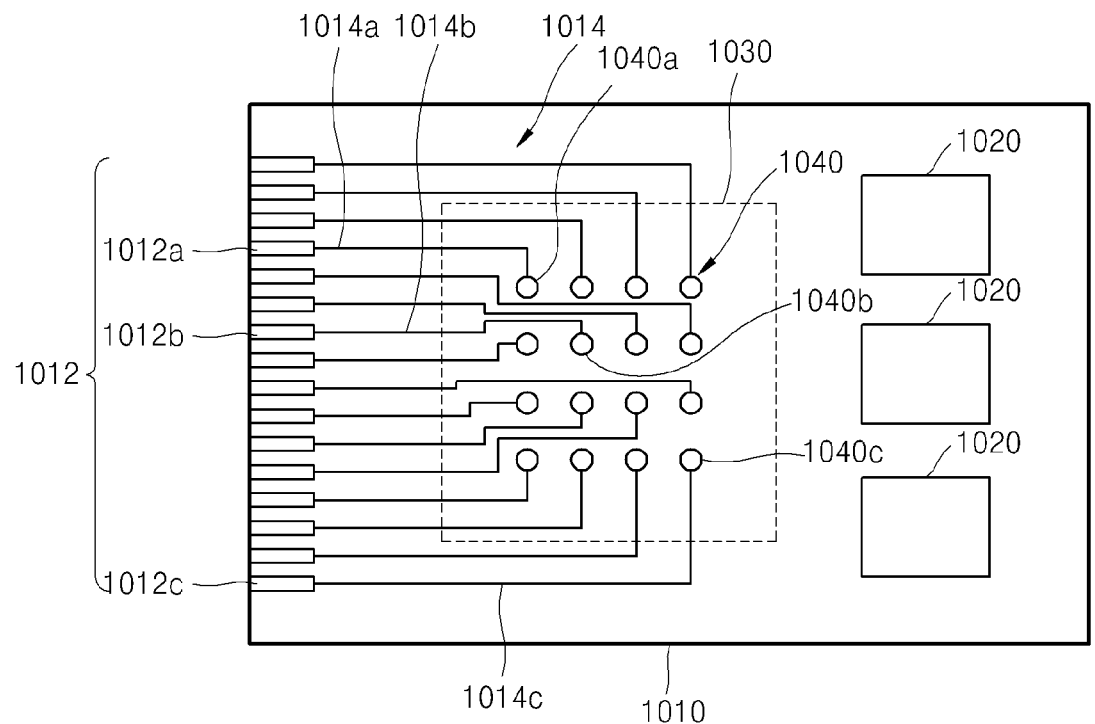
FIGS. 13, 14, 15 and 16 are various drawings showing modules, cards, electronic systems, and electronic devices in which certain embodiments of the inventive concept may be incorporated.

FIG. 13 is a plan view of a package module according to an embodiment of the inventive concept.

Referring to FIG. 13, the package module may include a module substrate 1010 having external connection terminals 1012, a semiconductor chip 1020 mounted on the module substrate 1010, and a semiconductor package 1030. The semiconductor chip 1020 and/or the semiconductor package 1030 may include at least one of the semiconductor devices described with reference to FIGS. 1 through 6. For example, the semiconductor package 1030 may include a system-in-package that includes a plurality of semiconductor chips, namely, the first through third semiconductor chips 310, 320, and 330 mounted on the interposer 200. A connection portion 1040 may be interposed between the semiconductor package 1030 and the module substrate 1010. The connection portion 1040 may include, for example, one selected from the group consisting of a conductive bump, a conductive spacer, a ball grid array (BGA), and a pin grid array (PGA), or a combination of thereof. The semiconductor package 1030 and the module substrate 1010 may be electrically connected through the connection portion 1040.

The connection portion 1040 may be electrically connected to the external connection terminals 1012 through conductive lines 1014. For example, referring to FIGS. 13 and 5A, a signal required for operating the first semiconductor chip 310 may be inputted to the module substrate 1010 through a first external connection terminal 1012a, and may be supplied to the first semiconductor chip 310 through a first conductive line 1014a, a first connection portion 1040a, a first through via 230a, and a first wire pattern 242.

Power required to operate the first semiconductor chip 310 may be supplied through a second external connection terminal 1012b, a second conductive line 1014b, a second connection portion 1040b, and a second through via 230b. A power signal or other type of signal required to operate the second semiconductor chip 320 may be supplied, separately from the power supply path to the first semiconductor chip 310, through a third external connection terminal 1012c, a third conductive line 1014c, a third connection portion 1040c, and a third through via 230c. The package module may be connected to external electronic devices through the external connection terminals 1012.

Figure 14:
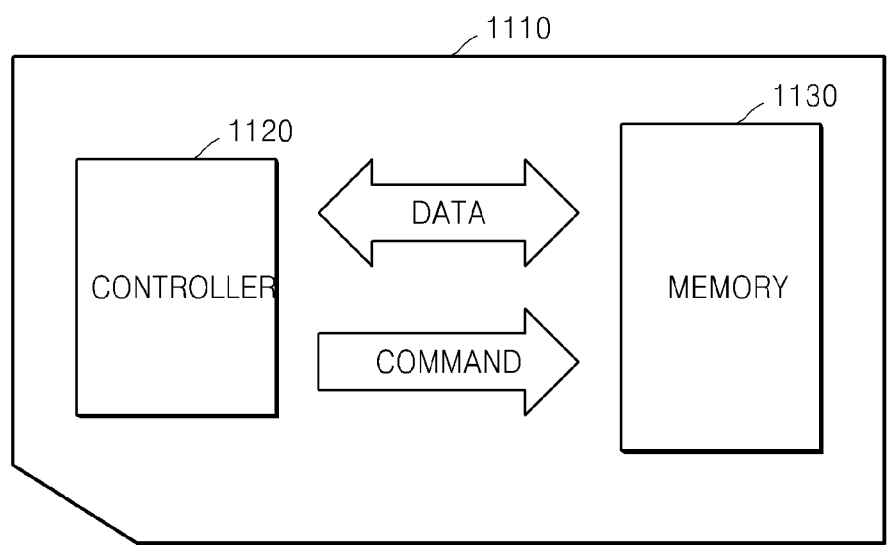

FIG. 14 is a schematic drawing showing a card according to an embodiment of the inventive concept.

Referring to FIG. 14, the card may include a controller 1120 and a memory 1130 in a housing 1110. The controller 1120 and the memory 1130 may exchange electrical signals. For example, the memory 1130 and the controller 1120 may exchange data in response to a command of the controller 1120. Accordingly, a memory card may store data in the memory 1130 or output data to the outside from the memory 1130.

The card may include the semiconductor devices according to the embodiments described with reference to FIGS. 1 through 6. For example, the first semiconductor chip 310 of FIG. 5A may include the controller 1120, and the second semiconductor chip 320 may include the memory. The controller 1120 and the memory 1130 may exchange commands or data through the third wire pattern 246 that connects the first semiconductor chip 310 and the second semiconductor chip 320. The third wire pattern 246 is disposed on the first insulator 220a, and thus, signal loss may be reduced in a process of transmitting command and/or data, thereby enabling high speed communication between the first and second semiconductor chips 310 and 320. A card having improved performance may be provided by applying the semiconductor device according to the embodiment of the inventive concept.

The card may be used as a data storing medium for various mobile devices. For example, the card may include a multimedia card (MMC) or a secure digital (SD) card.

Figure 15:
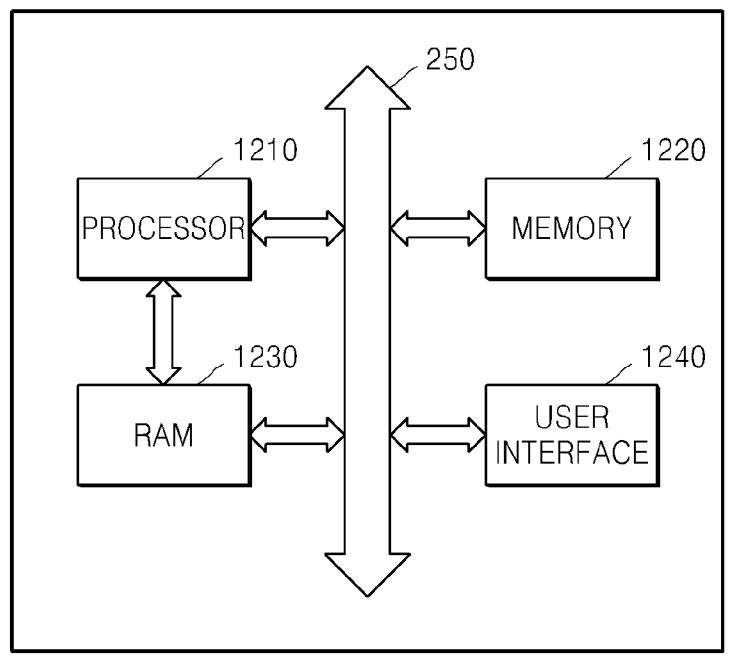

FIG. 15 is a general diagram showing an electronic system according to an embodiment of the inventive concept.

Referring to FIG. 15, the electronic system may include at least one of the semiconductor devices according to the embodiments described with reference to FIGS. 1 through 6. The electronic system may be applied to mobile devices or computers. For example, the electronic system may include a processor 1210, a memory 1220, a RAM 1230, and a user interface 1240, and these may perform data communication via a bus 1250. The processor 1210 may function to execute a program and control the electronic system. The RAM 1230 may be used as an operation memory of the processor 1210. The processor 1210 and the RAM 1230 may be included in one package.

For example, referring FIG. 6, the first semiconductor chip 400a that includes the processor 1210 and the second semiconductor chip 400b that includes the RAM 1230 may communicate with each other by being included in one package. The processor 1210 and the RAM 1230 may exchange signals through the first wire pattern 440a that connects the first semiconductor chip 400a and the second semiconductor chip 400b. Since the first semiconductor chip 400a is disposed on the insulator 420, transmission signal loss may be reduced, thereby better enabling high speed communication between the first semiconductor chip 400a and the second semiconductor chip 400b. An electronic system having improved performance may be provided by applying the semiconductor device according to the embodiment of the inventive concept.

The user interface 1240 may be used to input or output data to or from the electronic system. The memory 1220 may store codes for operating the processor 1210, data processed by the processor 1210, and data inputted from the outside. The memory 1220 may include a controller and a memory, and may be configured substantially identical or similar to the card of FIG. 14.

Figure 16:
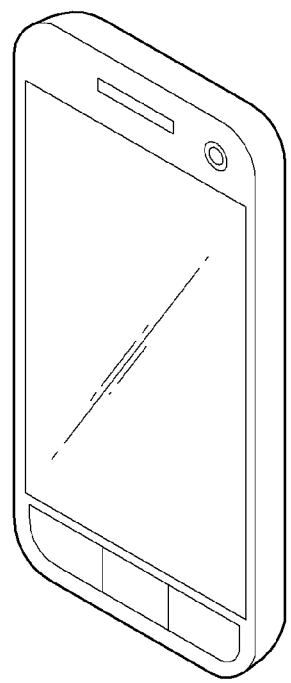

The electronic system of FIG. 15 may be applied to an electronic control system of various electronic devices. FIG. 16 is a schematic perspective view of a mobile phone to which the electronic system of FIG. 15 is applied. In addition to this, the electronic system of FIG. 15 may be applied to portable gamers, mobile notebooks, MP3 players, navigation devices, solid state discs (SSD), automobiles, or household appliances, etc.

While the inventive concept has been particularly shown and described with reference to exemplary embodiments thereof, it will be understood by one of ordinary skill in the art that embodiments should be considered in descriptive sense only and not for purposes of limitation and various changes in form and details may be made therein without departing from the scope of the inventive concept.

What is claimed is:

1. A semiconductor device comprising:
   an interposer including:
   a silicon substrate having a recessed region formed on a first surface;
   a first through via penetrating the silicon substrate from the first surface to an opposing second surface;
   a second through via penetrating the silicon substrate from the first surface to the second surface;
   an insulator disposed in the recessed region and disposed between the first through via and the second through via on the first surface; and
   a wire pattern disposed directly on the insulator in the recessed region and electrically connected between the first through via and the second through via; and
   a semiconductor chip mounted on one of the first surface and the second surface of the interposer and electrically connected to the wire pattern,
   wherein the wire pattern extends horizontally on the insulator and a level of a bottom of the wire pattern is substantially the same as a level of the first surface.

2. The semiconductor device of claim 1, wherein each one of the first through via and the second through via comprises a via insulating film covering respective sidewalls of a first via hole and a second via hole penetrating the silicon substrate, and a first via electrode and a second via electrode respectively disposed on the via insulating film in the first via hole and second via hole, such that the insulator physically and respectively contacts the via insulating film of the first via hole and the second via hole.

3. The semiconductor device of claim 2, wherein the insulator surrounds at least one of the first through via and the second through via.

4. The semiconductor device of claim 1, wherein the insulator has a thickness of at least 10 um.

5. The semiconductor device of claim 1, wherein the insulator comprises at least one selected from an oxide group consisting of $SiO_2$, SiOC, and SiOCH.

6. The semiconductor device of claim 1, wherein the substrate comprises at least one material selected from a group consisting of un-doped silicon, p-type silicon, SiC, and SiGe.

7. A semiconductor device comprising:
   an interposer including:
   a silicon substrate having a recessed region formed on a first surface of the substrate;
   a first through via penetrating a first region of the silicon substrate from the first surface to an opposing second surface;
   an insulator disposed in the recessed region; and
   a first wire pattern at least partially disposed on the insulator and electrically connected to the first through via;
   a second wire pattern electrically isolated from the first wire pattern and disposed on the insulator;
   a passivation film disposed on the first surface of the substrate to cover the first wire pattern and the second wire pattern; and
   a first semiconductor chip mounted over the first region and on the first surface of the silicon substrate, the first semiconductor chip being electrically connected to the first wire pattern via a first conductive portion extending through the passivation film, and being electrically connected to the second wire pattern via a second conductive portion extending through the passivation film,
   wherein the first wire pattern extends horizontally on the insulator and a level of a bottom of the first wire pattern is substantially the same as a level of the first surface.

8. The semiconductor device of claim 7, wherein at least a portion of the insulator overlaps the first region.

9. The semiconductor device of claim 8, wherein a combination of the first through via and the first wire pattern transmits a non-power signal to the first semiconductor chip.

10. The semiconductor device of claim 9, wherein the interposer further comprises a second through via penetrating a second region of the substrate outside the first region of the substrate from the first surface of the substrate to the second surface of the substrate, and the second through via transmits a power signal to the first semiconductor chip.

11. The semiconductor device of claim 10, wherein the first semiconductor chip is mounted over at least a portion of the first region and at least a portion of the second region.

12. The semiconductor device of claim 10, further comprising:
a second semiconductor chip separate from the first semiconductor chip and mounted on the interposer,
wherein the first semiconductor chip and the second semiconductor chip are electrically connected via at least the second wire pattern.

13. The semiconductor device of claim 12, wherein the first semiconductor chip is a logic chip and the second semiconductor chip is a memory chip.

14. The semiconductor device of claim 12, further comprising:
a third through via penetrating the substrate from the first surface to the second surface in the recessed region, such that the recessed region is disposed between the first through via and the third through via on the first surface; and
a wire pattern configured as a passive device and wholly disposed on the insulator in the recessed region and electrically connected between the first through via and the third through via,
wherein the first semiconductor chip is electrically connected to the passive device.

15. The semiconductor device of claim 1, wherein the insulator is an oxide having a thermal conductivity greater than that of the silicon substrate.

16. The semiconductor device of claim 1, wherein the interposer further comprises a passivation film formed on the first surface of the silicon substrate and selectively exposing a portion of the first wire pattern.

* * * * *